US010170485B2

(12) United States Patent
Guillorn et al.

(10) Patent No.: US 10,170,485 B2
(45) Date of Patent: Jan. 1, 2019

(54) THREE-DIMENSIONAL STACKED JUNCTIONLESS CHANNELS FOR DENSE SRAM

(71) Applicant: International Business Machines Corporation, Armonk, NY (US)

(72) Inventors: Michael A. Guillorn, Yorktown Heights, NY (US); Robert R. Robison, Colchester, VT (US); Reinaldo Vega, Mahopac, NY (US); Rajasekhar Venigalla, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/010,589

(22) Filed: Jun. 18, 2018

(65) Prior Publication Data

US 2018/0342525 A1    Nov. 29, 2018

Related U.S. Application Data

(62) Division of application No. 15/603,572, filed on May 24, 2017.

(51) Int. Cl.
*H01L 29/423* (2006.01)
*H01L 27/11* (2006.01)
*H01L 21/84* (2006.01)
*H01L 21/822* (2006.01)
*H01L 29/417* (2006.01)
(Continued)

(52) U.S. Cl.
CPC ...... *H01L 27/1108* (2013.01); *H01L 21/8221* (2013.01); *H01L 21/84* (2013.01); *H01L 29/41791* (2013.01); *H01L 29/42392* (2013.01); *H01L 29/785* (2013.01); *H01L 29/7855* (2013.01); *H01L 29/7856* (2013.01); *H01L 21/845* (2013.01); *H01L 29/78618* (2013.01); *H01L 29/78696* (2013.01)

(58) Field of Classification Search
None
See application file for complete search history.

(56) References Cited

U.S. PATENT DOCUMENTS

2010/0207208 A1*  8/2010  Bedell .................... B82Y 10/00
                                                  257/346
2011/0031473 A1    2/2011  Chang et al.
(Continued)

OTHER PUBLICATIONS

Wu, Xusheng, et al., "A Three-Dimensional Stacked Fin-CMOS Technology for High-Density ULSI Circuits", IEEE Transactions on Electron Devices, vol. 52, No. 9, Sep. 2005, pp. 1998-2003.
(Continued)

*Primary Examiner* — Minh-Loan Tran
(74) *Attorney, Agent, or Firm* — Harrington & Smith

(57) ABSTRACT

A structure comprises a first channel region forming an n-channel device; a second channel region forming a p-channel device, the p-channel device being stacked with the n-channel device in a vertical orientation; a gate positioned around the stacked n-channel device and p-channel device; and at least one source region and at least one drain region extending from each of the n-channel device and the p-channel device. Each of the at least one source region and the at least one drain region within the stacked n-channel device and p-channel device are independently contacted.

20 Claims, 19 Drawing Sheets

(51) Int. Cl.
*H01L 29/78* (2006.01)
*H01L 29/786* (2006.01)

(56) References Cited

U.S. PATENT DOCUMENTS

2016/0043074 A1* 2/2016 Hurley ................ H01L 21/8258
                                                              257/351
2017/0005188 A1* 1/2017 Cheng ................... H01L 29/775
2017/0345923 A1    11/2017 Chen

OTHER PUBLICATIONS

Wu, Xusheng, et al., "Stacked 3-D Fin-CMOS Technology", IEEE Electron Device Letters, vol. 26, No. 6, Jun. 2005, pp. 416-418.
Dupre, C., et al., "15nm-diameter 3D Stacked Nanowires with Independent Gates Operation: ΦFET", IEEE, Feb. 2009, 4 pages.
List of IBM Patents or Patent Applications Treated as Related, Jun. 2018, 2 pgs.

* cited by examiner

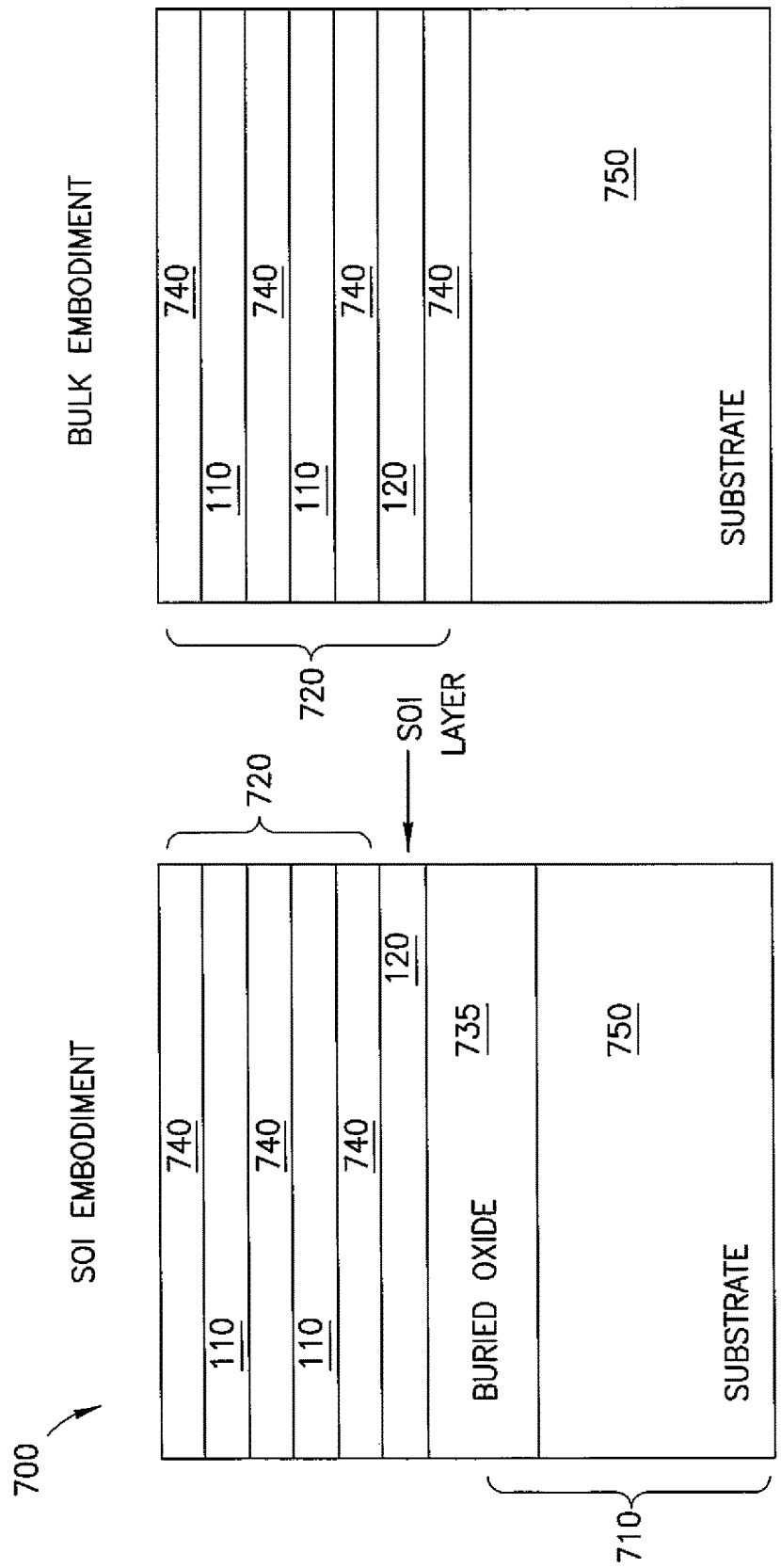

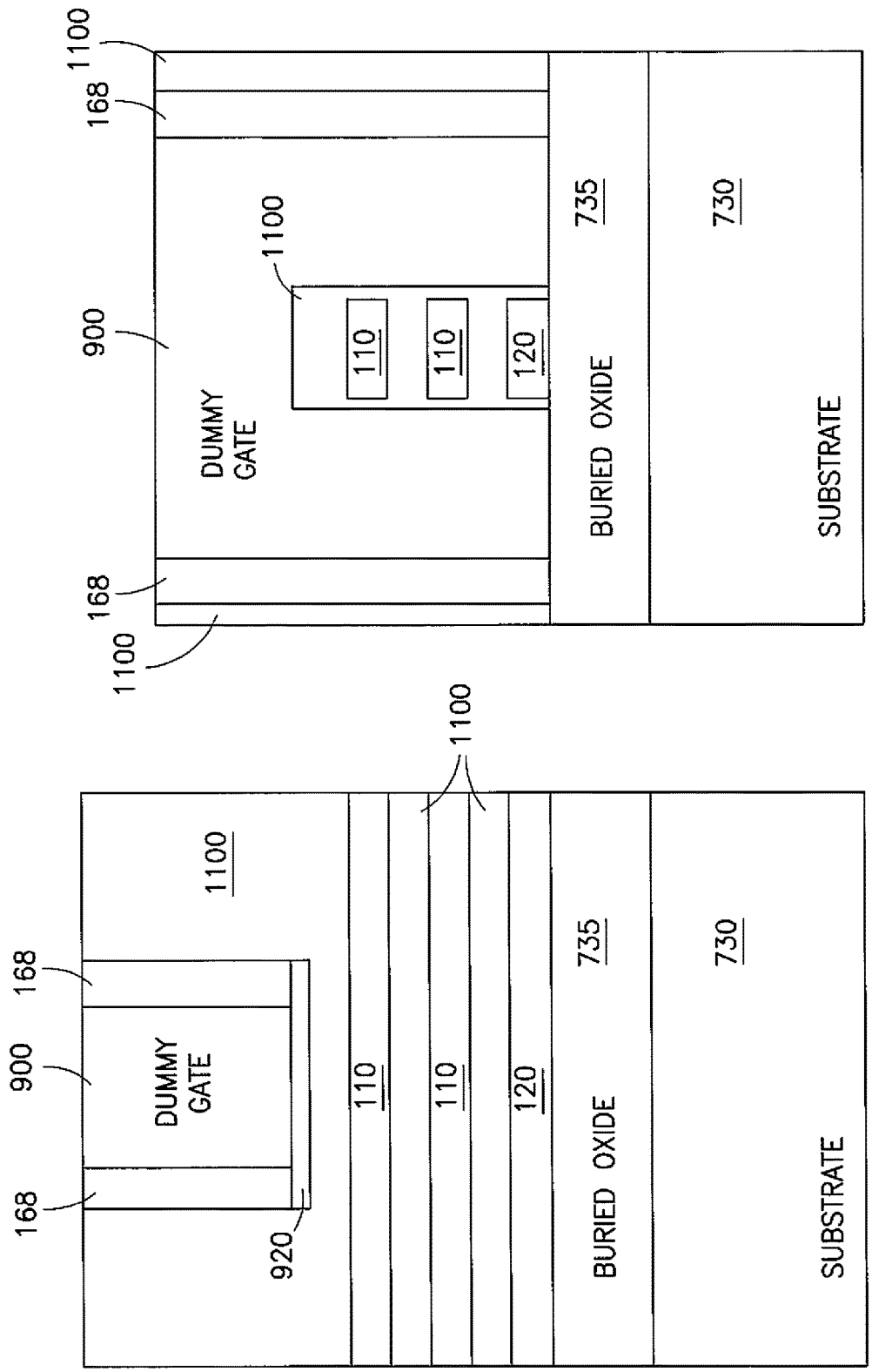

THREE-DIMENSIONAL STACKED JUNCTIONLESS CHANNELS FOR DENSE SRAM

CROSS REFERENCE TO RELATED APPLICATION

This patent application is a divisional patent application of copending U.S. patent application Ser. No. 15/603,572, filed May 24, 2017, the disclosure of which is incorporated by reference herein in its entirety.

BACKGROUND

Static Random Access Memory (Static RAM or SRAM) is a type of semiconductor memory that uses bistable latching circuitry (flip-flop circuitry) to read, write, or store one bit of data. Each of the two stable states characterize values corresponding to "0" and "1." The one bit of stored data is held in a static form and is considered volatile in the sense that the data is lost when the memory is no longer powered.

In an SRAM cell, an arrangement of transistors is used to carry out the read, write, and store operations. For example, in a six transistor (6T) SRAM cell, a core is formed by two pairs of transistors, each pair forming an inverter, in which the output potential of each inverter is fed as the input potential to the other inverter to form a feedback loop that stabilizes the inverters to their respective states. The inverters allow for the storage of the one bit of data. The other two transistors are access transistors that provide access to the stored data for the read and write applications. The access transistors are each coupled to a word line and bit lines. Upon the application of voltages through the word line and bit lines, the states of the inverters and access transistors are switched on or off, thus directing the SRAM cell to read, write, or store data.

The transistors may be arranged using three-dimensional stacking schemes to increase the densities of the architectures that form the SRAM cells. However, these stacking schemes generally employ wafer stacking or SIMOX processes (separation by implantation of oxygen). Such stacking or SIMOX processes are typically costly and do not permit tight vertical stacking to form logic gates and SRAM cells having the desired densities.

BRIEF SUMMARY

In one aspect, a structure comprises a first channel region forming an n-channel device; a second channel region forming a p-channel device, the p-channel device being stacked with the n-channel device in a vertical orientation; a gate positioned around the stacked n-channel device and p-channel device; and at least one source region and at least one drain region extending from each of the n-channel device and the p-channel device. Each of the at least one source region and the at least one drain region within the stacked n-channel device and p-channel device are independently contacted.

In another aspect, a unit cell for a transistor structure comprises a junctionless PFET device comprising at least one layer of a p-doped material; a junctionless NFET device comprising at least two layers of an n-doped material stacked on the junctionless PFET device; an inverter gate wrapped around the stacked junctionless PFET device and junctionless NFET device; a passgate wrapped around the stacked junctionless PFET device and junctionless NFET device; a first set of contacts extending to the p-doped material of the junctionless PFET device; a second set of contacts extending to the n-doped material of the junctionless NFET device; a voltage) input contact extending to the inverter gate; and a wordline contact extending to the passgate.

In another aspect, a method comprises forming a heteroepitaxial stack of layers of a p-doped material, an n-doped material, and a sacrificial material; patterning the heteroepitaxial stack; forming a dummy gate on the patterned heteroepitaxial stack; forming sidewall spacers on the dummy gate; removing the sacrificial material from between the layers of p-doped material and n-doped material; depositing a dielectric isolation material adjacent the sidewall spacers and between the layers of p-doped material and n-doped material; removing the dummy gate to form a gate opening; removing the dielectric isolation material from between the layers of p-doped material and n-doped material; depositing a gate dielectric on surfaces in the gate opening and on the layers of p-doped material and n-doped material under the gate opening; depositing a workfunction metal on the gate dielectric; filling the gate opening with a fill metal; and forming contacts to the layers of p-doped material and n-doped material. The deposited gate dielectric on the layers of p-doped material and n-doped material and the deposited workfunction metal define junctionless field effect transistor devices.

BRIEF DESCRIPTION OF THE SEVERAL VIEWS OF THE DRAWINGS

The foregoing and other aspects of exemplary embodiments are made more evident in the following Detailed Description, when read in conjunction with the attached Drawing Figures, wherein:

FIGS. 7A and 7S are cross-sectional views of exemplary embodiments of process flow in which heteroepitaxial layers are formed on substrates;

FIGS. 11A and 11B are cross-sectional views of an exemplary embodiment of process flow in which a dielectric isolation material is deposited in open spaces adjacent to the sidewall spacers and between heteroepitaxial layers;

DETAILED DESCRIPTION

The term "exemplary" is used herein to mean "serving as an example, instance, or illustration." Any embodiment described herein as "exemplary" is not necessarily to be construed as preferred or advantageous over other embodiments. All of the embodiments described in this Detailed Description are exemplary embodiments provided to enable persons skilled in the art to make or use the invention and not to limit the scope of the invention which is defined by the claims.

The terms "epitaxial growth and/or deposition" and "epitaxially formed and/or grown" mean the growth of a semiconductor material on a deposition surface of a semiconductor material, in which the semiconductor material being grown has the same crystalline characteristics as the semiconductor material of the deposition surface. In an epitaxial deposition process, the chemical reactants provided by source gases are controlled and the system parameters are set so that the depositing atoms arrive at the deposition surface of the semiconductor substrate with sufficient energy to alter their locations on the surface and orient themselves to the crystal arrangement of the atoms of the deposition surface. Therefore, an epitaxial semiconductor material has the same crystalline characteristics as the deposition surface on which it is formed. For example, an epitaxial semiconductor material deposited on a {100} crystal surface will take on a {100} orientation. In some embodiments, epitaxial growth and/or deposition processes are selective to forming on semiconductor surfaces and do not deposit material on dielectric surfaces, such as silicon dioxide or silicon nitride surfaces.

Figure 1:
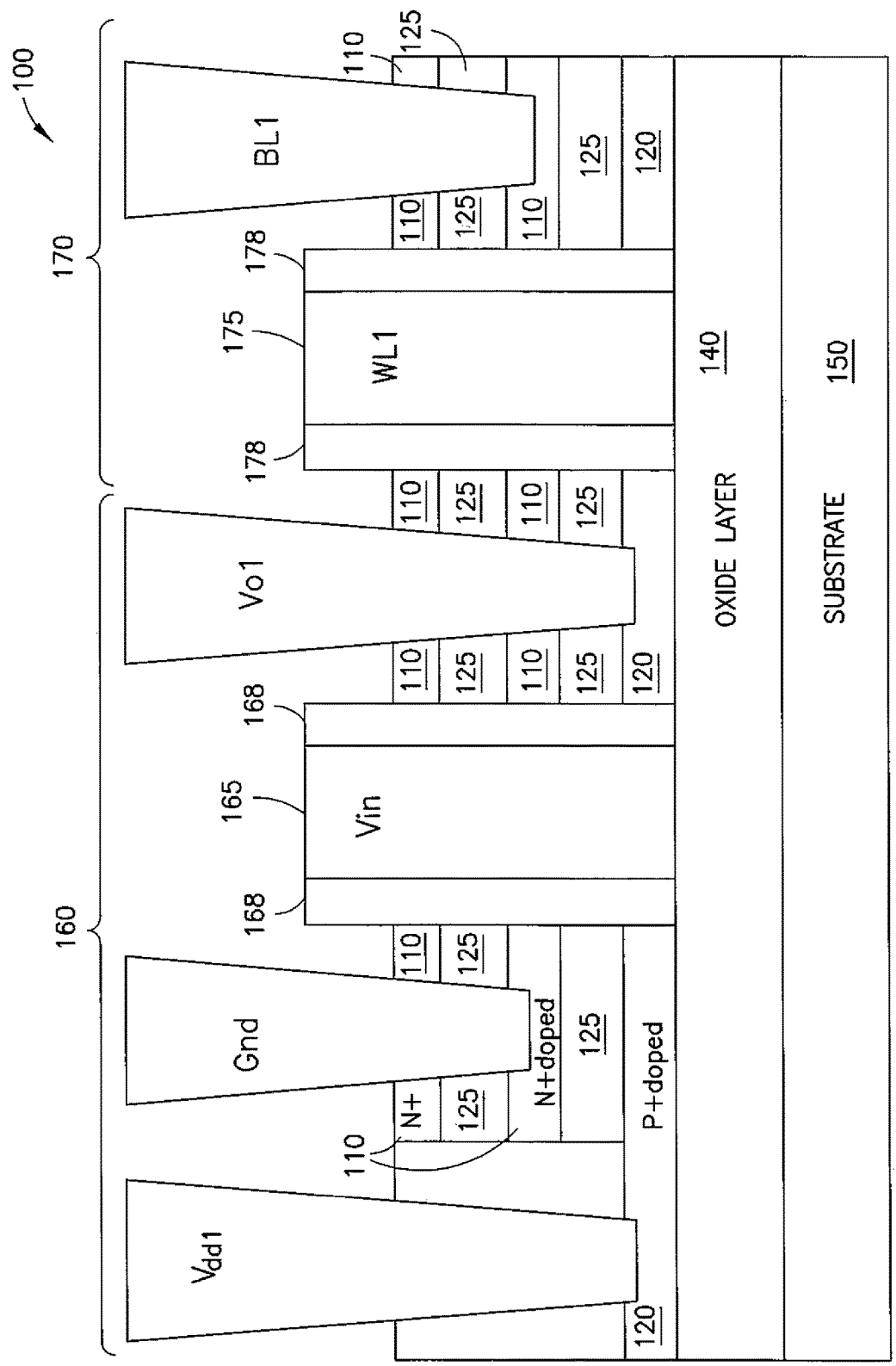
FIG. 1 is a cross-sectional view of one exemplary embodiment of an SRAM unit cell having junctionless channels.

Referring to FIG. 1, one exemplary embodiment of a transistor structure used to form an SRAM unit cell is designated generally by the reference number 100 and is hereinafter referred to as "structure 100." In the structure 100, in-situ doped junctionless channels may be formed by epitaxial growth, with sacrificial epitaxial layers also being formed for release of the junctionless channels. Accordingly, junctionless NFET and PFET devices may be formed using one epitaxial growth recipe, with a single wrap-around gate for both stacked channels. Such a structure allows circuit density to be increased without increasing the scaling of gate length or gate pitch. This enables a basic inverter construction to be carried out using a single "fin" configuration. A buffer may also be embodied with a "two-fin" configuration. Thus, junctionless NFET and PFET devices may form an SRAM cell using the two-fin configuration. In such a configuration, tunability in gamma and beta ratios may be achieved through a combination of epitaxial channel thickness and the in-situ doping. The in-situ doping can be individually tuned or optimized to enhance the performance of each of the NFET and PFET devices.

The structure 100 may comprise regions of vertically stacked layers of n-doped material 110 and p-doped material 120 alternatingly arranged with layers of dielectric material. The layers of the n-doped material 110, the p-doped material 120, and the dielectric material 125 may also be arranged with gate structures to form n-channel devices (e.g., the NFETs) and p-channel devices (e.g., the PFETs), with the n-doped material 110 and the p-doped material 120 being doped in-situ, and with contacts (shown at $V_{dd1}$, GND, $V_{o1}$, and BL1) extending to the n-doped material 110 or the p-doped material 120 of the vertically stacked layers. The vertically stacked layers of the n-doped material 110 and the p-doped material 120 may be disposed on an oxide layer 140, which may be disposed on a substrate 150 (e.g., silicon-on-insulator (SOI) or, in the alternative, bulk silicon). As shown, the structure 100 comprises an inverter 160 arranged with a passgate 170 to form a portion of the SRAM unit cell. The inverter 160 may include an inverter gate structure 165 having sidewall spacers 168 disposed in the vertically stacked layers. The passgate 170 may include a gate structure 175 having sidewall spacers 178 with a wordline contact WL1 coupled to the gate structure 175 disposed in the vertically stacked layers and a bitline contact BL1 coupled to a layer of the n-doped material 110.

Figure 2:
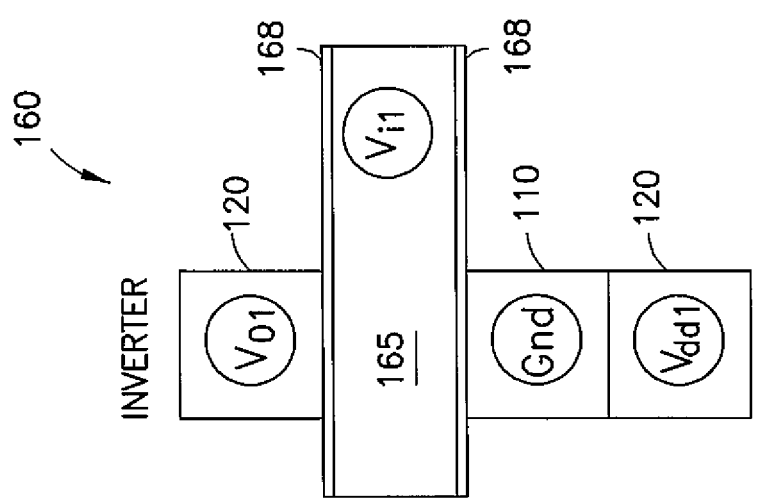
FIG. 2 is a top view of one exemplary embodiment of a portion of an inverter for a sub-cell of the SRAM unit of FIG. 1.

Referring to FIG. 2, one exemplary embodiment of a portion of the inverter 160 for use in the structure 100 is shown. The inverter 160 may comprise stacked layers of the n-doped material 110, the p-doped material 120, and the dielectric material 125 disposed adjacent to the transversely-positioned inverter gate structure 165 having a voltage input contact ($V_{i1}$) as the contact. As shown, on one side of the inverter gate structure 165, the stacked layers of the n-doped material 110, the p-doped material 120, and the dielectric material 125 are configured to receive a voltage output contact ($V_{o1}$) as the contact on an underlying layer of the p-doped material 120. On an opposite side of the inverter gate structure 165, the stacked layers of the n-doped material 110, the p-doped material 120, and the dielectric material 125 are configured to receive a ground contact (Gnd) as the contact on a layer of the n-doped material 110 and a drain voltage contact ($V_{dd1}$) on a layer of the p-doped material 120.

Figure 3:
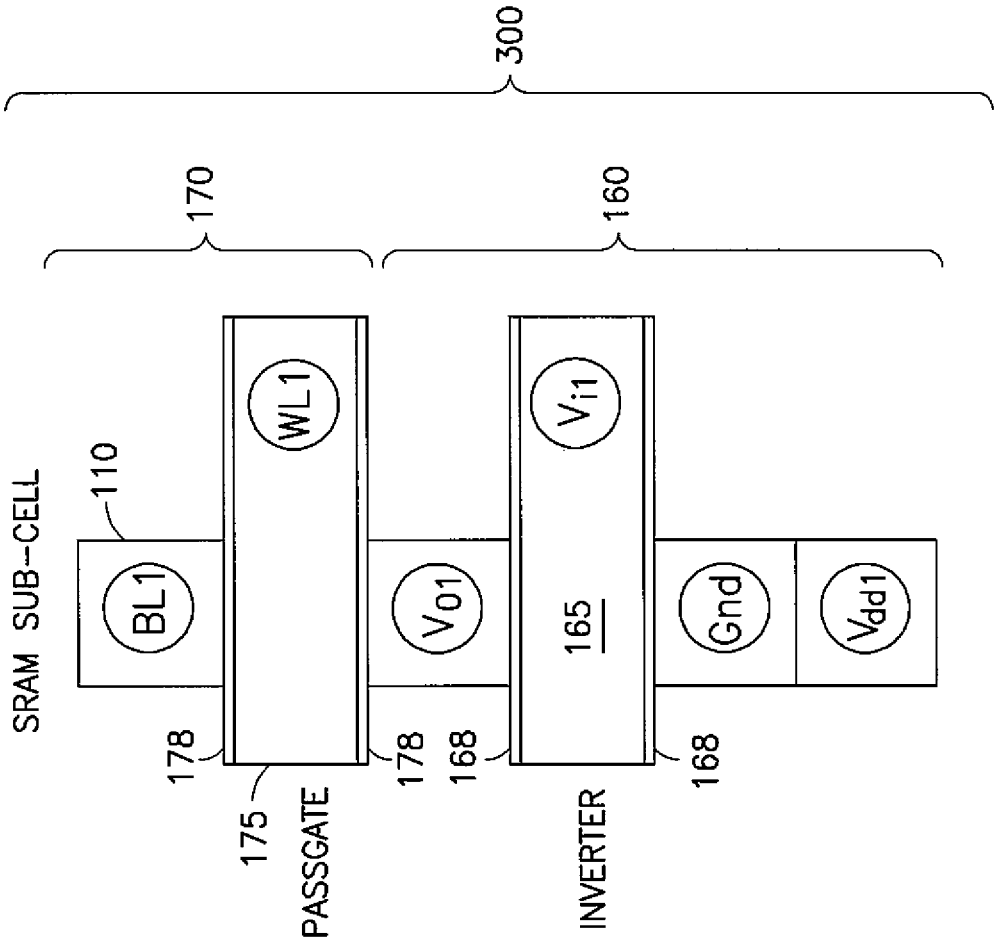
FIG. 3 is a top view of one exemplary embodiment of the inverter of FIG. 2 with a passgate forming a sub-cell of the SRAM unit of FIG. 1.

Referring to FIG. 3, a portion of the inverter 160 is shown with the passgate 170 (with a via for the wordline contact WL1) and associated stacked layers of the n-doped material 110, the p-doped material 120, and the dielectric material. 125 as a portion of the SRAM sub-cell, indicated at 300, and used to form the structure 100. As shown, the portion of the inverter 160 having the stacked layers of the n-doped material 110, the p-doped material 120, and the dielectric material 125 configured to receive the $V_{o1}$ contact may be positioned adjacent to the passgate 170. Stacked layers of the n-doped material 110, the p-doped material 120, and the dielectric material 125 on an opposite side of the passgate 170 are configured to receive the bitline contact BL1 coupled to a layer of the n-doped material 110.

Figure 4:
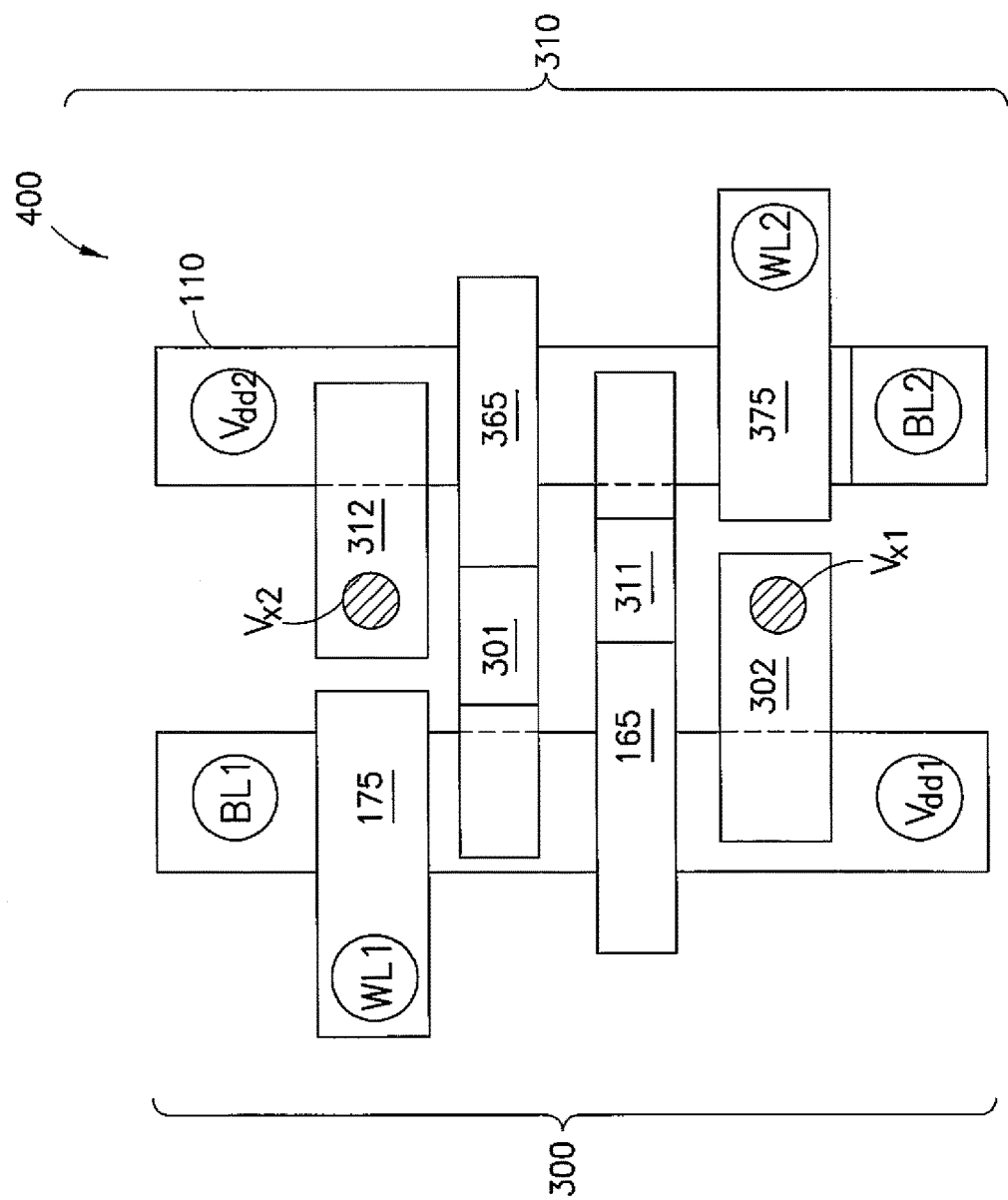
FIG. 4 is a schematic representation of reciprocally-oriented configurations of two SRAM sub-cells.

Referring to FIG. 4, one exemplary embodiment of a transistor structure forming at least a portion of an SRAM unit cell is shown generally at 400. The SRAM unit cell 400 may comprise reciprocally-oriented configurations of two SRAM sub-cells as depicted in FIG. 3. For example, the SRAM sub-cell 300 may be arranged with a second SRAM sub-cell 310 having a second gate structure 375 and a via for a second wordline contact WL2, a second inverter gate structure 365, a via for a second bitline BL2, and a via for a second drain voltage contact $V_{dd2}$). The first SRAM sub-cell 300 is coupled to the second inverter gate structure 365 of the second SRAM sub-cell 310 using a first interconnect layer 301, and the second SRAM sub-cell 310 is coupled to the inverter gate structure 165 of the first SRAM sub-cell 300 using a second interconnect layer 311. A third interconnect layer 302 may be coupled to the Gnd (not shown) on the first SRAM sub-cell 300, and a fourth interconnect layer 312 may be coupled to a second ground (not shown) on the second SRAM sub-cell 310. The third interconnect layer 302 and the fourth interconnect layer 312 may be coupled to an M1 metal layer (in FIG. 5) using a via $V_{x1}$ and a via $V_{x2}$, respectively, to form suitable local connections to M1 metal layers.

Figure 5:
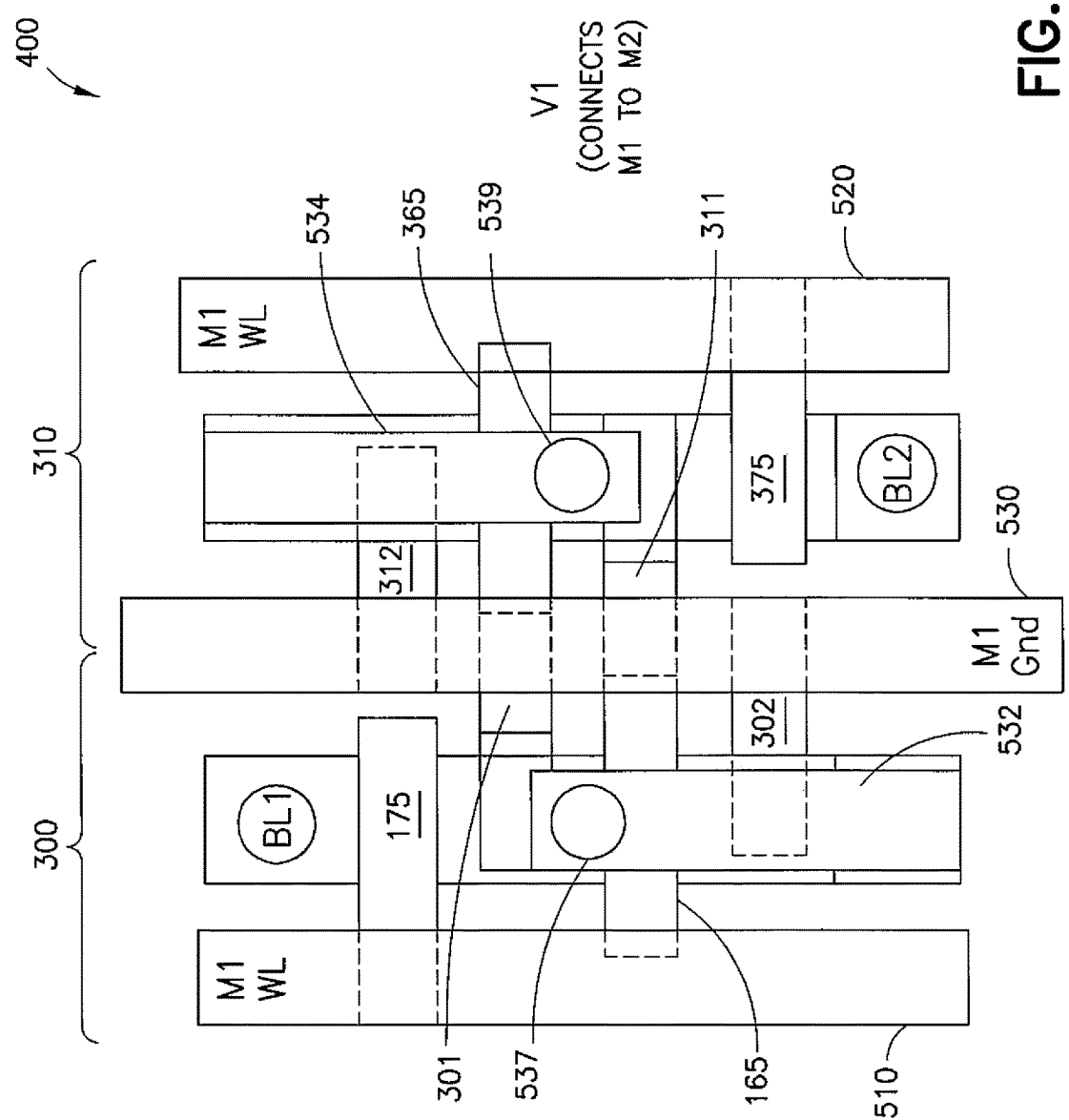
FIG. 5 is a schematic representation of the two SRAM sub-cells of FIG. 4 with M1 metal layers disposed on the wordlines and on the grounds.

Referring to FIG. 5, a first M1 metal layer 510 may be disposed in contact with the via for the wordline contact WL1 (not shown) on the gate structure 175, a second M1 metal layer 520 may be disposed in contact with the via for the wordline contact WL2 (not shown) on the gate structure 375, and a ground M1 metal layer 530 may be disposed in direct contact with the via $V_{x1}$ and the via $V_{x2}$ (not shown). Also, a third M1 layer 532 may be disposed on the inverter of the first SRAM sub-cell 300, and a fourth M1 layer 534 may be disposed on the inverter of the second SRAM sub-cell 310 (with accompanying V1 vias 537, 539), each of the third M1 layer 532 and fourth M1 layer 534 being configured for the routing of power ($V_{dd}$) to their associated SRAM sub-cell.

Figure 6:
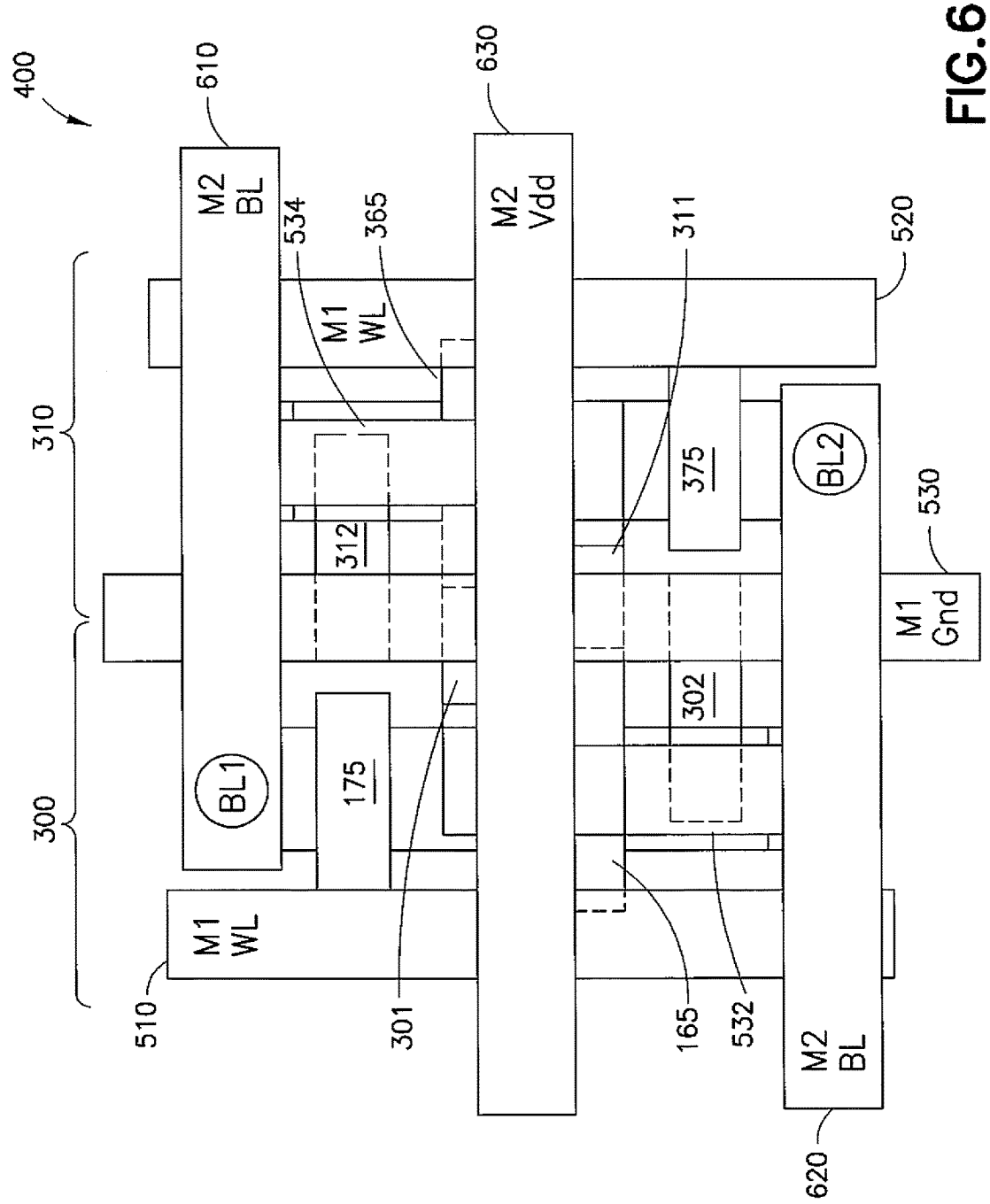
FIG. 6 is a schematic representation of the two sub-cells of FIG. 5 with M2 metal layers disposed across the M1 layers and on the bitlines and drain voltage contacts.

Referring to FIG. 6, a first M2 metal layer 610 may be coupled to the bitline BL1, and a second M2 metal layer 620 may be coupled to the bitline BL2. A third M2 metal layer 630 may be connected to the $V_{dd}$ through the V1 vias 537, 539 (FIG. 5). The bitline BL1 and the bitline BL2 may couple various portions of the transistor structure to the M2 metal layers. Thus, an SRAM layout may incorporate approximately five M1 metal layers and three. M2 metal layers, which may include all of the power, ground, wordline, and bitline connections.

Referring to FIGS. 7A-19, an example embodiment of a process flow to form the structure 100 having an SRAM sub-cell 300 as described herein is shown generally at 700 and is hereinafter referred to as "process flow 700." The process of forming the SRAM sub-cell 300 may utilize a substrate 150 comprising silicon-on-insulator (SOI) substrate 710 as shown in FIG. 7A, or it may utilize a substrate 750 comprising bulk material as shown in FIG. 7B. Process flow 700 is hereinafter described as using the SOI substrate 710, although it should be understood that the process flow 700 is not so limited and that the substrate 750 comprising bulk material may be used. In either embodiment, nanosheet channel materials are epitaxially grown and/or deposited or otherwise formed on the substrate (or substrate/intervening layer combination) to form a heteroepitaxial stack 720.

Referring back to FIG. 7A, the SOI substrate 710 may be provided as having a handle portion 730 and an SOI layer, with a buried oxide layer 735 (BOX layer 735) therebetween. The SOI layer comprises a layer of p-type material that is doped in-situ to form the bottom layer of p-doped material 120. Alternating layers of a sacrificial material 740 and an n-type material, which is doped in-situ to form the layers of n-doped material 110, are epitaxially grown and/or deposited or otherwise formed on the layer of the p-doped material 120 to form the heteroepitaxial stack 720. The sacrificial material 740 may be silicon germanium (SiGe). For the n-type material, the in-situ doping may be with phosphorous and/or arsenic during the epitaxial growth. For the p-type material, the in-situ doping may be with boron.

Figure 8A:
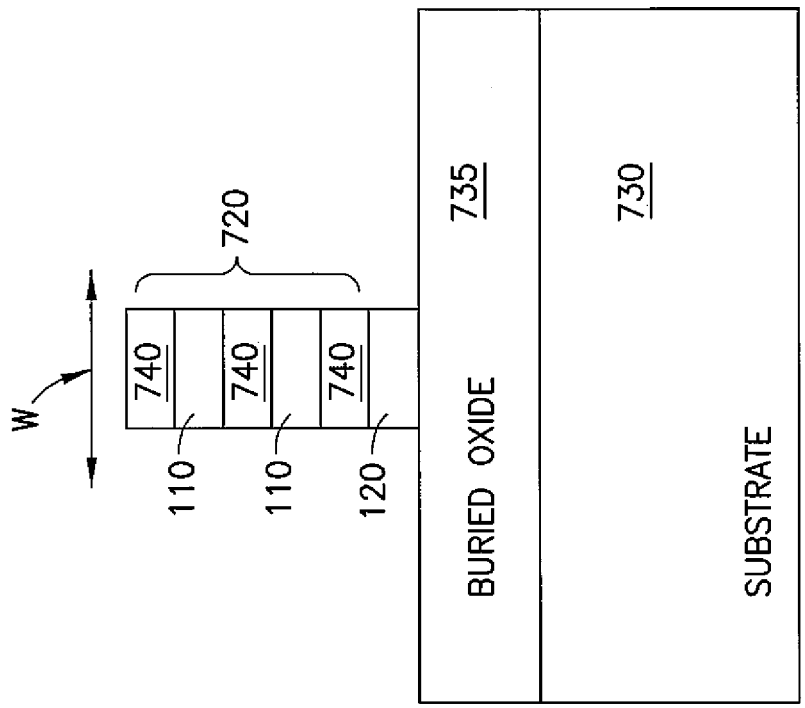
FIGS. 8A and 8B are cross-sectional views of an exemplary embodiment of process flow in which the heteroepitaxial layers of FIG. 7A are patterned.
Figure 8B:
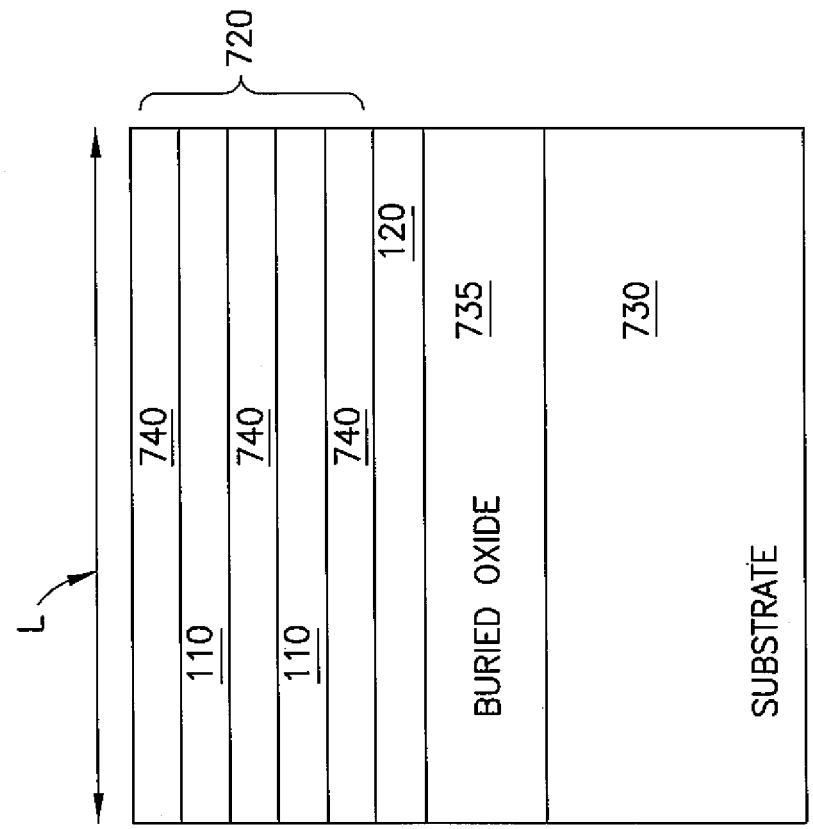

Referring to FIGS. 8A and 8B, the process flow 700 is continued by patterning the nanosheets of the heteroepitaxial stack 720. The resulting structure comprises a thin stack of the layers of sacrificial material 740 and n-doped material 110, on the p-doped material 120, having a length L (FIG. 8A) and having a width W (FIG. 8B).

Figure 9B:
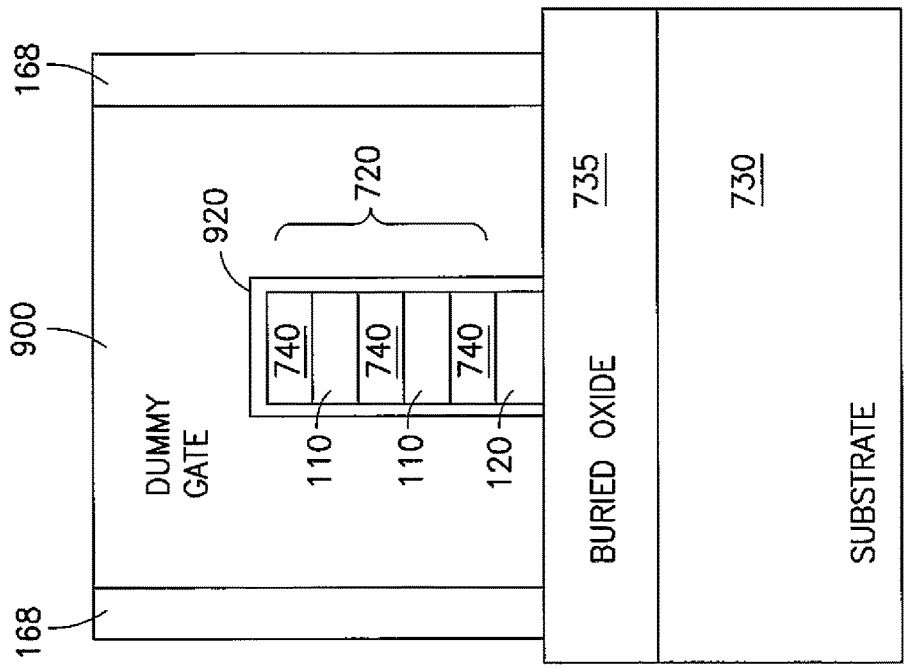
FIGS. 9A and 9B are cross-sectional views of an exemplary embodiment of process flow in which a dummy gate and sidewall spacers are formed over the patterned heteroepitaxial layers.
Figure 9A:
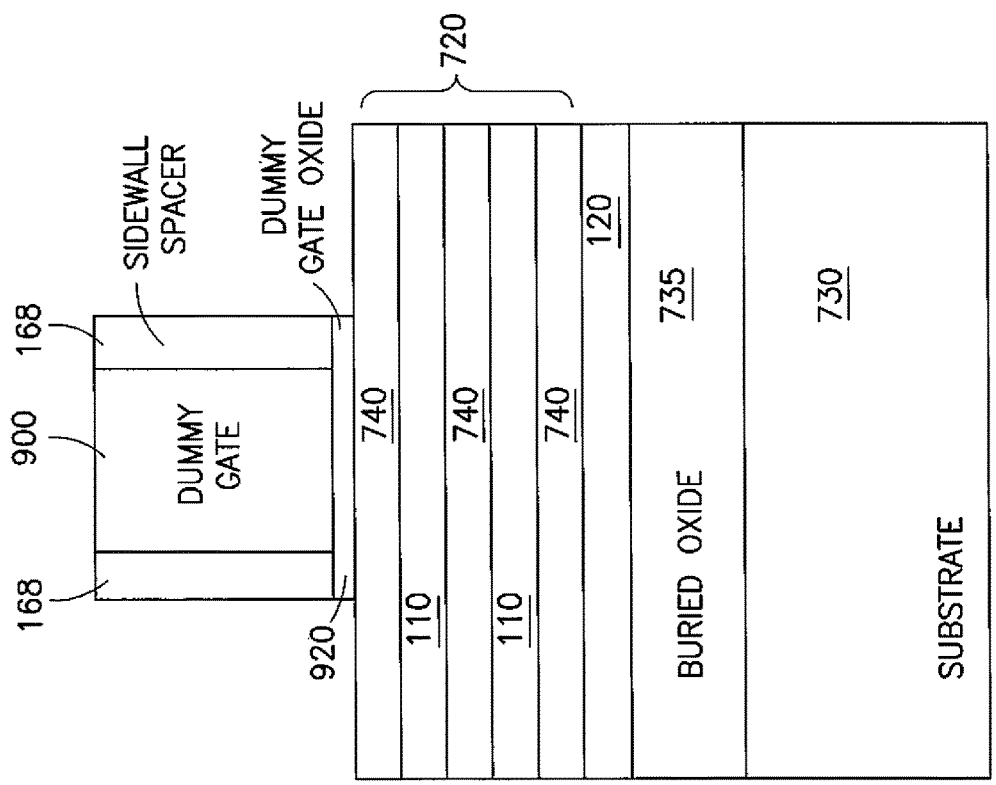

Referring to FIGS. 9A and 9B, a dummy gate 900 and sidewall spacers 168 may be formed perpendicularly over the cut nanosheets of the heteroepitaxial stack 720. The dummy gate 900 and sidewall spacers 168 are elongated and formed across the nanosheets of the heteroepitaxial stack 720 along the length L and transverse to the width W. FIG. 9A shows the dummy gate 900 and sidewall spacers 168 along the length L, and FIG. 9B shows the dummy gate 900 and sidewall spacers 168 along the width W. The deposition of the dummy gate 900 and sidewall spacers 168 may be by any suitable technique. For example, a dummy gate oxide layer 920 may be disposed at least across the portion of the cut nanosheets forming the heteroepitaxial stack 720. A layer of polysilicon material may be disposed on the dummy gate oxide layer 920 and subsequently etched to form the dummy gate structures. The sidewall spacers 168 may then be deposited or epitaxially grown, deposited, or formed on the sides of the polysilicon material by any suitable method. Suitable processes for the deposition of layers and materials described herein include, but are not limited to, chemical vapor deposition (CVD) processes.

Figure 10B:
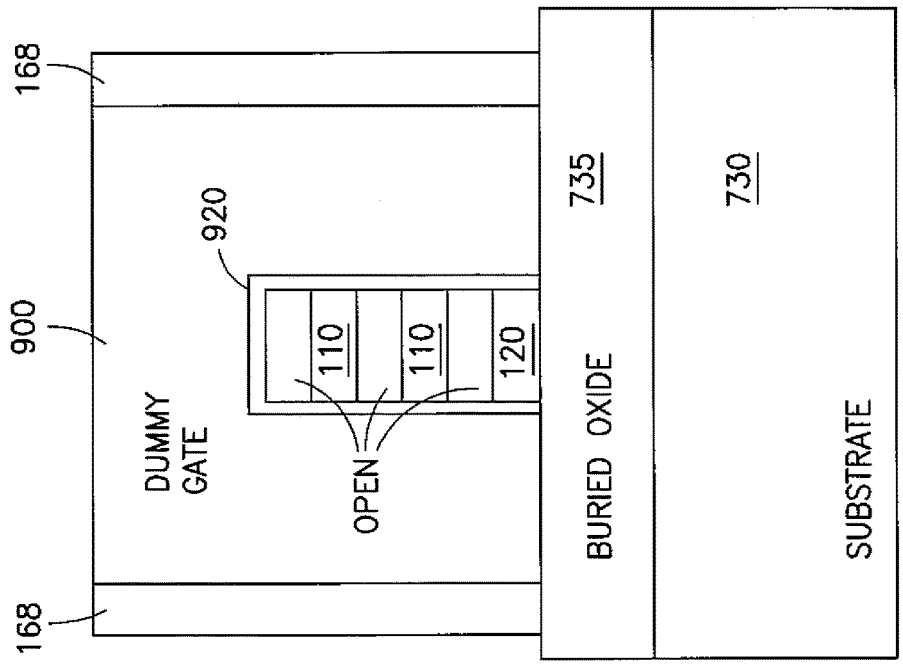
FIGS. 10A and 10B are cross-sectional views of an exemplary embodiment of process flow in which sacrificial layers are removed from the heteroepitaxial layers.
Figure 10A:
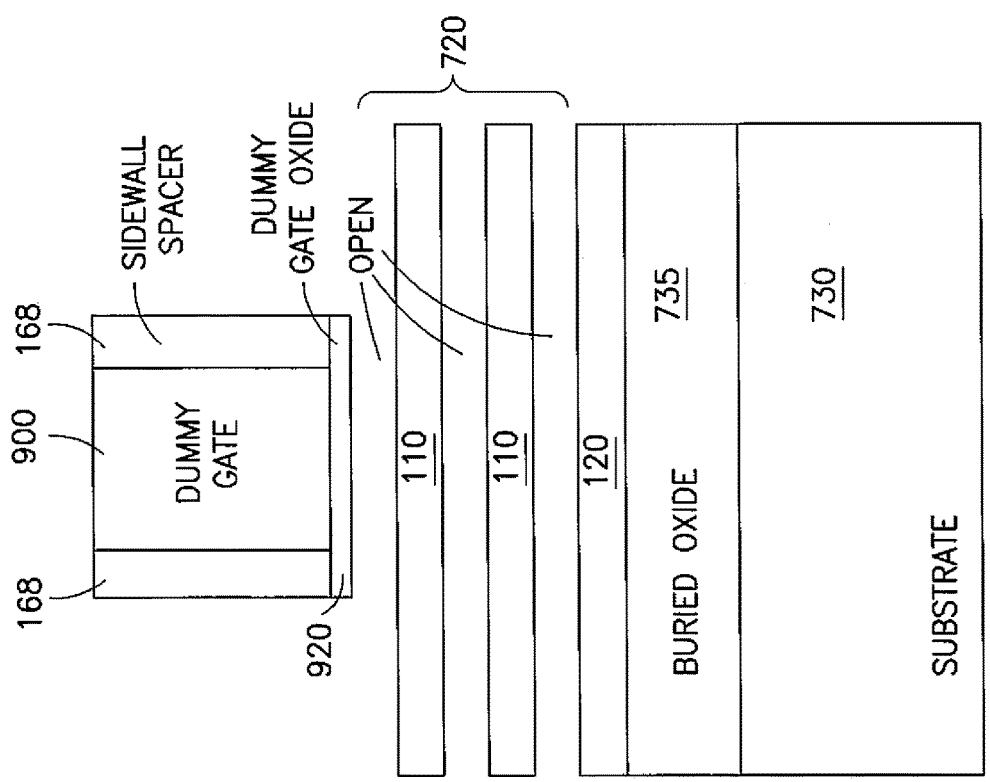

Referring to FIGS. 10A and 10B, the layers of the sacrificial material 740 may be selectively removed by an aqueous hot phosphoric acid ($H_3PO_4$) wash. Upon removal of the sacrificial material 740, the layers of n-doped material 110 and the layers of p-doped material 120 are spaced apart, with open spaces remaining along the length L of the nanosheets forming the heteroepitaxial stack 720 as well as along the width W parallel to and inside the gate structure.

Referring to FIGS. 11A and 11B, the open areas resulting from the removal of the sacrificial material 740 from the heteroepitaxial stack 720 may be filled with a dielectric isolation material 1100. The dielectric isolation material 1100 may also be used to fill areas adjacent to the dummy gate structure (the dummy gate 900 and the sidewall spacers 168). The dielectric isolation material 1100 may comprise, for example, any suitable silicon oxide ($SiO_x$), such as silicon dioxide ($SiO_2$). The resulting structure may then be planarized using a chemical mechanical polish (CMP).

Figure 12B:
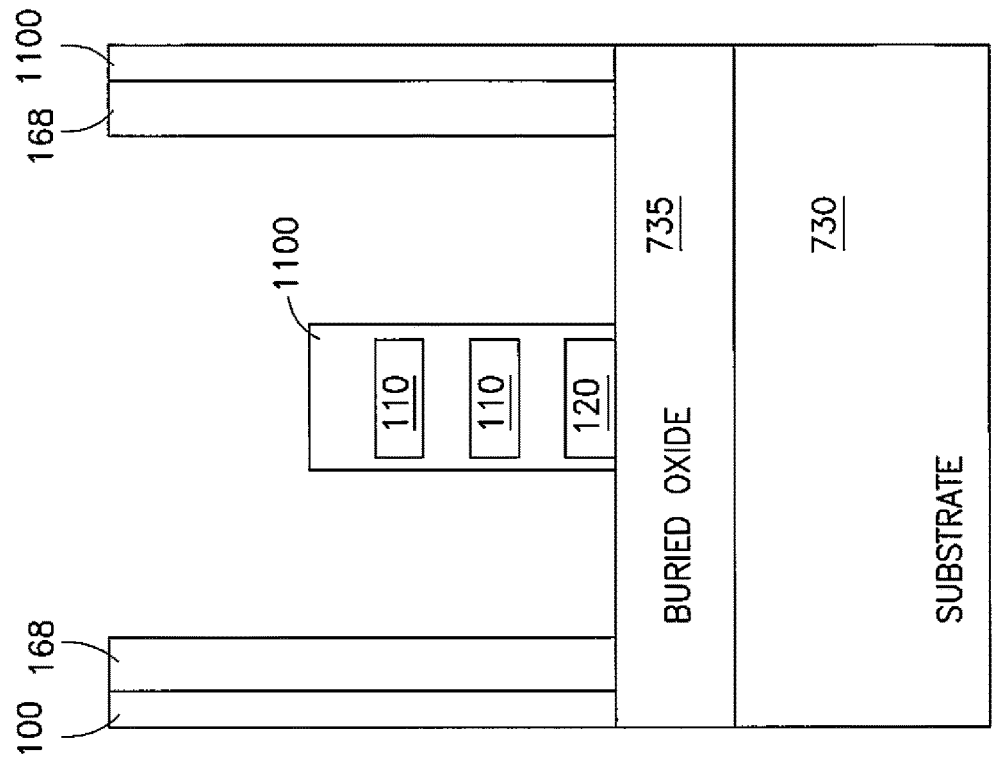
FIGS. 12A and 12B are cross-sectional views of an exemplary embodiment of the structure of FIGS. 11A and 11B in which the dummy gate is removed.
Figure 12A:
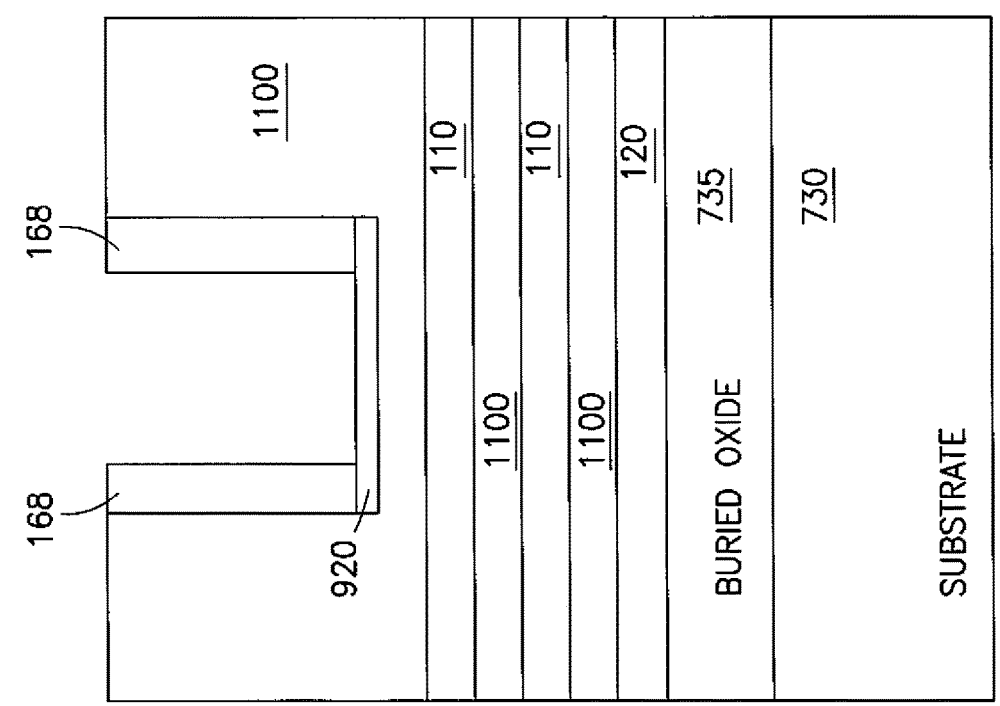

Referring to FIGS. 12A and 12B, the dummy gate 900 may be removed. The dummy gate 900 may be removed by, for example, a wet etching process (e.g., using phosphoric acid ($H_3PO_4$)), thereby leaving the dummy gate oxide layer 920 and the dielectric isolation material 1100.

Figures 13A, 13B:
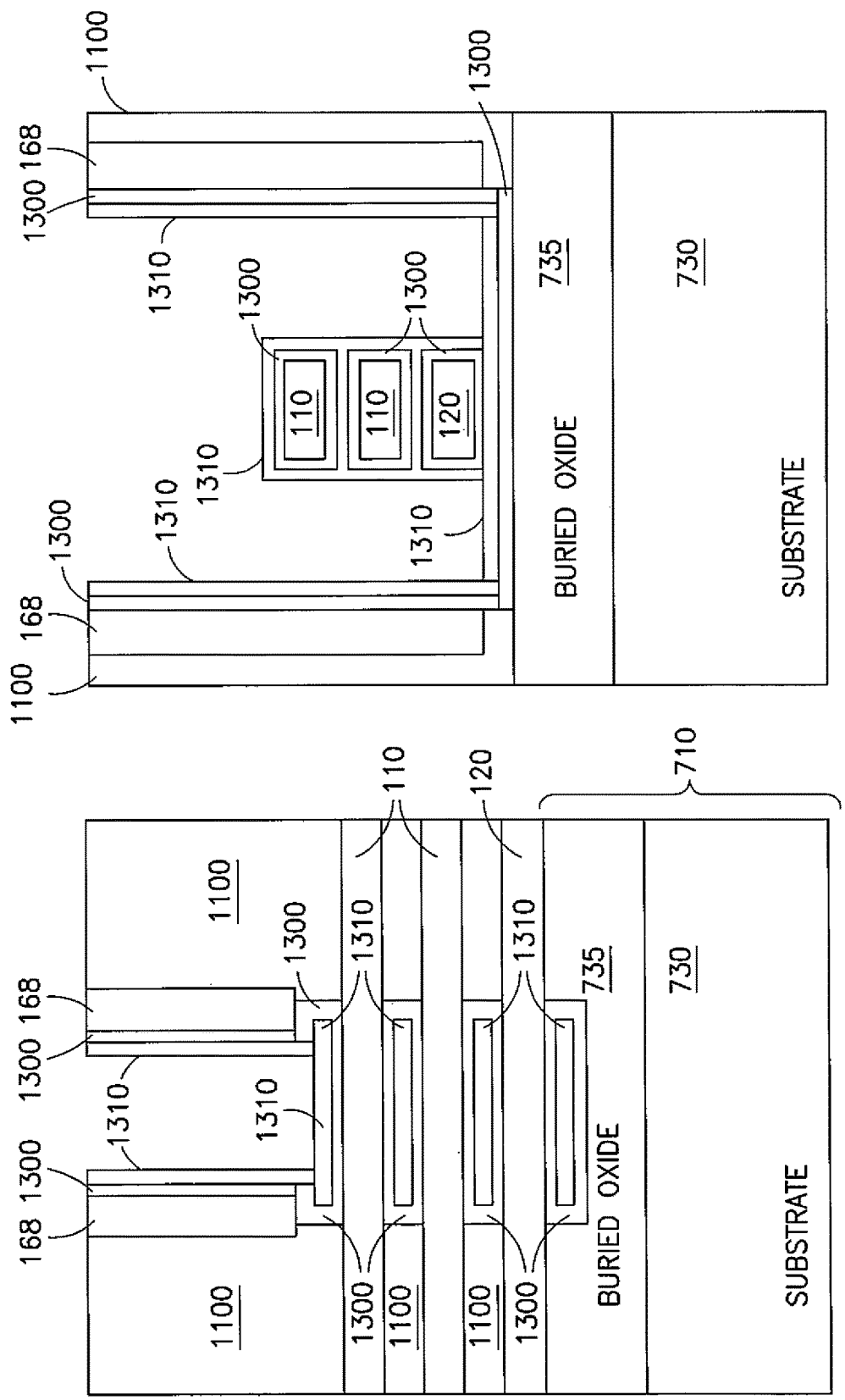
FIGS. 13A and 13B are cross-sectional views of an exemplary embodiment of the structure of process flow in which a gate dielectric layer and a workfunction metal is deposited.

Referring to FIGS. 13A and 13B, the dummy gate oxide layer 920 may be removed, for example, using a dry etch process (e.g., a reactive ion etch (RIE), plasma etching, or the like). The dielectric isolation material 1100 may also be removed from under the dummy gate oxide layer 920 and from between the layers of n-doped material 110 and the layers of p-doped material 120. In embodiments in which the substrate is the SOI substrate 710 and includes the BOX layer 735, in removing the dummy gate oxide layer 920, the BOX layer 735 may be undercut to remove portions of dielectric isolation material from under the sidewall spacers 168. Undercutting, however, may be limited in order to limit an amount of fringe capacitance in the finished structure. Undercutting also fully releases the bottom nanosheet layer forming the layer of p-doped material 120 from the BOX layer 735 (which is not the case in embodiments in which the substrate comprises bulk material as shown in FIG. 7B).

Once the dummy gate oxide layer 920 is removed and the dielectric isolation material 1100 is removed from between the layers of n-doped material 110 and the layers of p-doped material 120, a gate dielectric 1300 comprising one or more dielectric layers, such as a high-k dielectric and an interfacial oxide may be deposited and/or formed on the channel surface such as on inner surfaces of the sidewall spacers 168, on the SOI layer defined by the layer of p-doped material 120 between the sidewall spacers 168, between the layers of the n-doped material 110 and the p-doped material 120, and in the undercut areas under the sidewall spacers 168. The interfacial oxide may be disposed between the high-k dielectric and the channel surfaces. A workfunction metal 1310 may be deposited on exposed surfaces of the gate dielectric 1300, e.g., on the gate dielectric 1300 on the vertical surfaces of the sidewall spacers 168, on the gate dielectric 1300 in the undercut areas, and between the layers of gate dielectric 1300 on the n-doped material 110 and on the p-doped material 120. The gate dielectric 1300 may be deposited using a CVD technique. The workfunction metal 1310 may be up to about 5 nanometers (nm) in thickness, may comprise one or a combination of metals, and is generally deposited using an atomic layer deposition technique.

As shown, the layers of the n-doped material 110 and the layers of the p-doped material 120, having the gate dielectric 1300 and the workfunction metal 1310 disposed therebetween, may define NFETs. and PFETs having junctionless channels. For example, the layers of the n-doped material 110 may define an NFET, and the layers of the p-doped material 120 may define a PFET, the NFET and the PFET not having a junction therebetween.

Figures 14A, 14B:
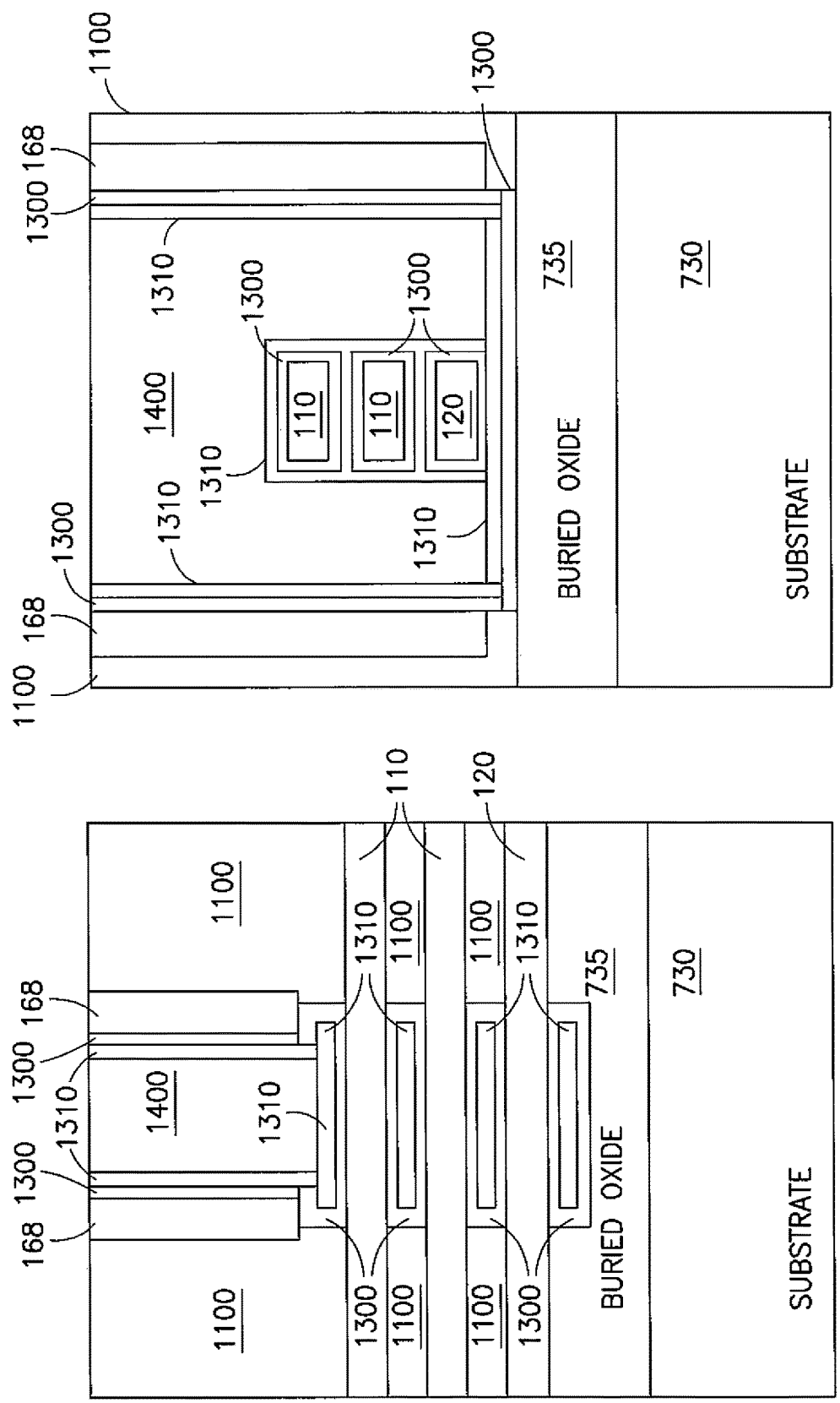
FIGS. 14A and 14B are cross-sectional views of an exemplary embodiment of process flow in which a replacement metal gate is formed on the gate dielectric layer and the workfunction metal.

Referring to FIGS. 14A and 14B, a metal gate material 1400 may be deposited on the workfunction metal 1310 to form a replacement metal gate (RMG). The metal gate material 1400 may be deposited by any suitable gate fill method, including, but not limited to, CVD. Once deposited, upper surfaces of the metal gate material 1400, sidewall spacers 168, and the dielectric isolation material 1100 may be planarized (e.g., by CMP).

Figure 15:
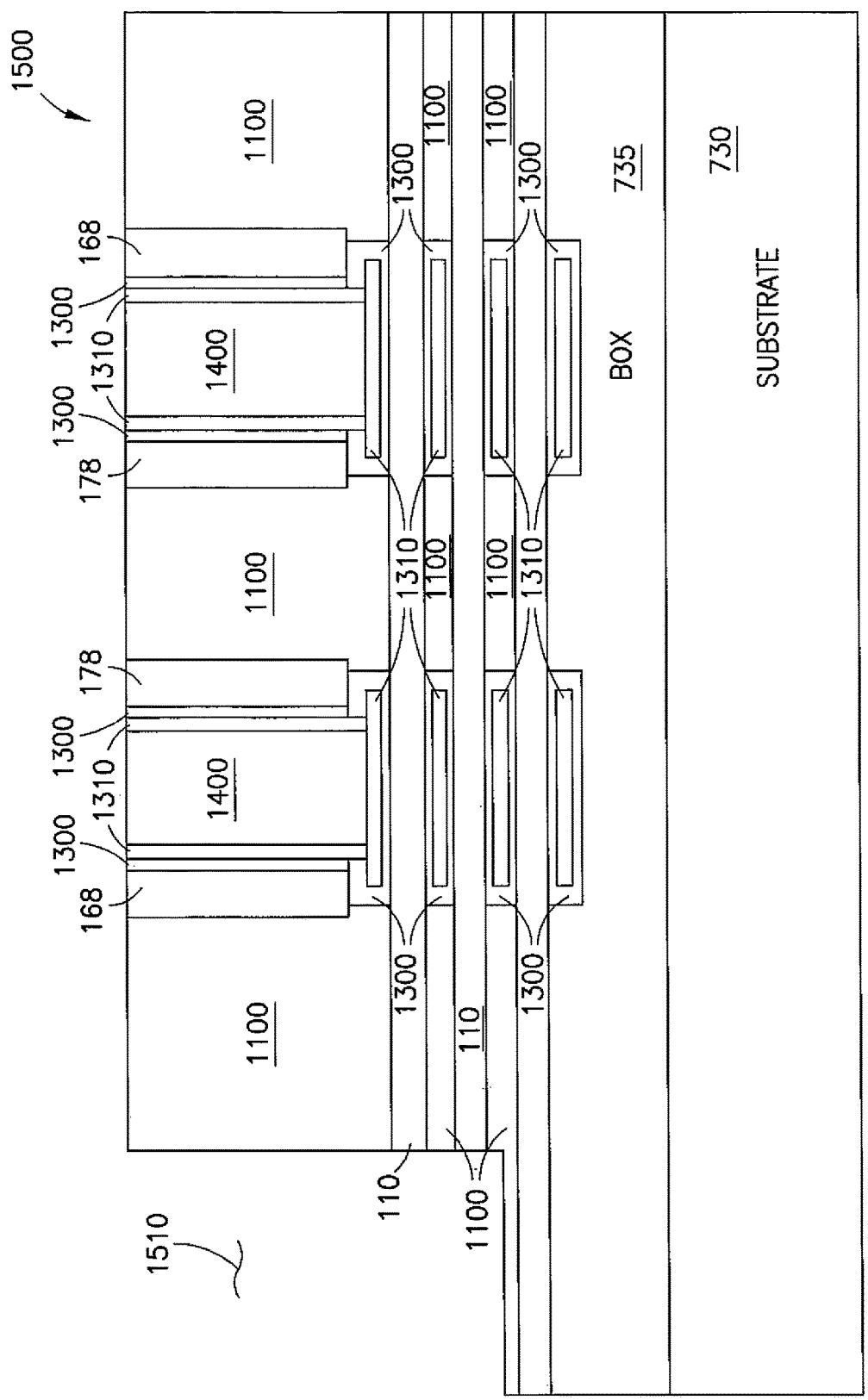
FIGS. 15-17 are cross-sectional views of exemplary embodiments of process flow in which a first set of contacts are formed in the structure.

Referring now to FIG. 15, a first contact formation 1500 may be formed in which contacts extend through the layers of n-doped material 110 to the layer of p-doped material 120. The contacts may be formed by etching through the dielectric isolation material 1100 and through the layers of the n-doped material 110, as necessary, using RIE for example. As shown, an etching may form an open area 1510 and may terminate before the layer of p-doped material 120, thereby leaving a thin layer of dielectric isolation material 1100 over the layer of p-doped material 120 to avoid shorting $V_{dd}$ to ground. Also, etching to form the open area 1510 may cause the termination of the n-doped layers 110. Methods by which the etching to form the open area 1510 may be carried out include, but are not limited to, RIE.

Figure 16:
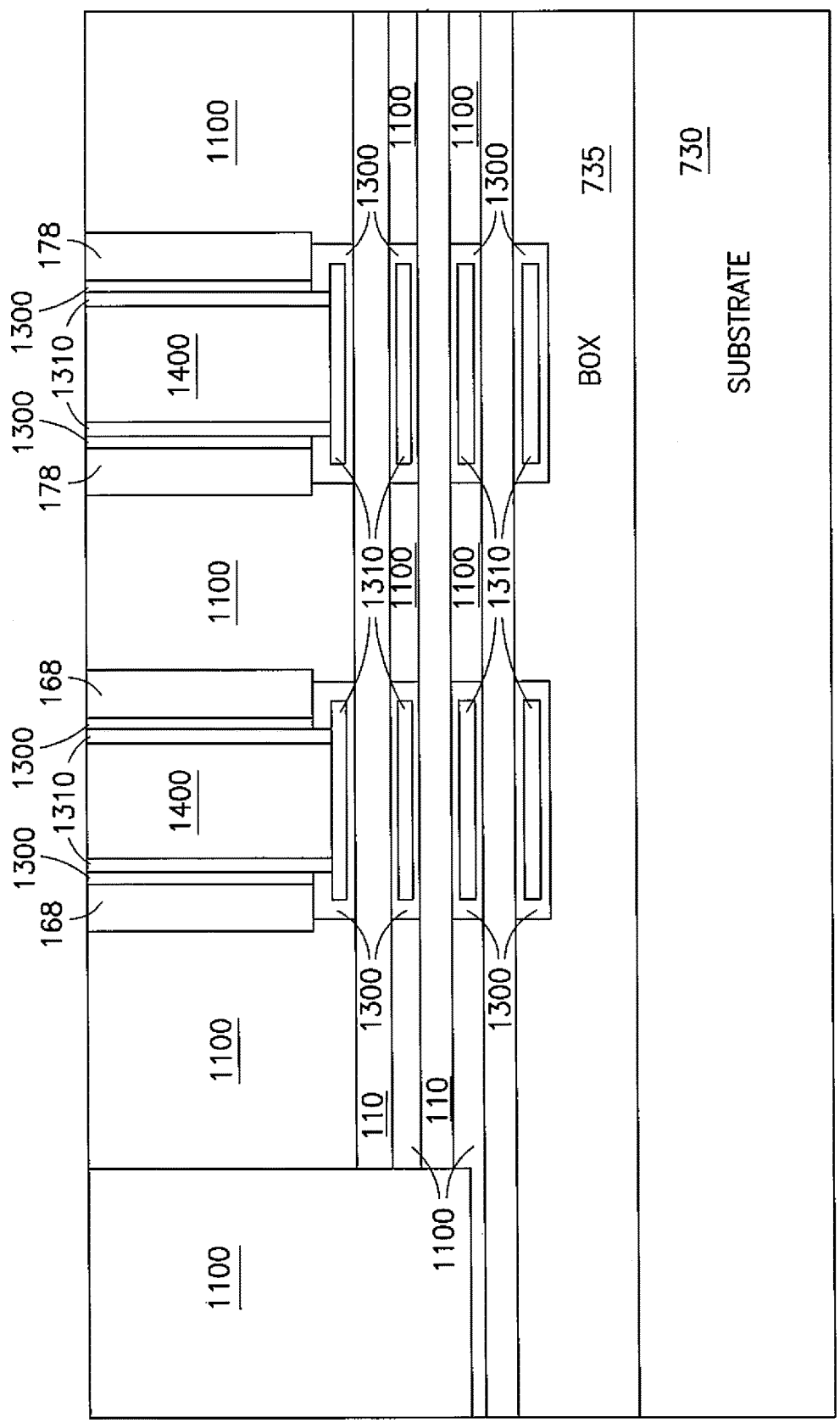

Referring now to FIG. 16, the open area 1510 may be filled with the dielectric isolation material 1100 (e.g., by CVD), thus terminating the layers of n-doped material 110 in the dielectric isolation material 1100. A planarization may be carried out using CMP.

Figure 17:
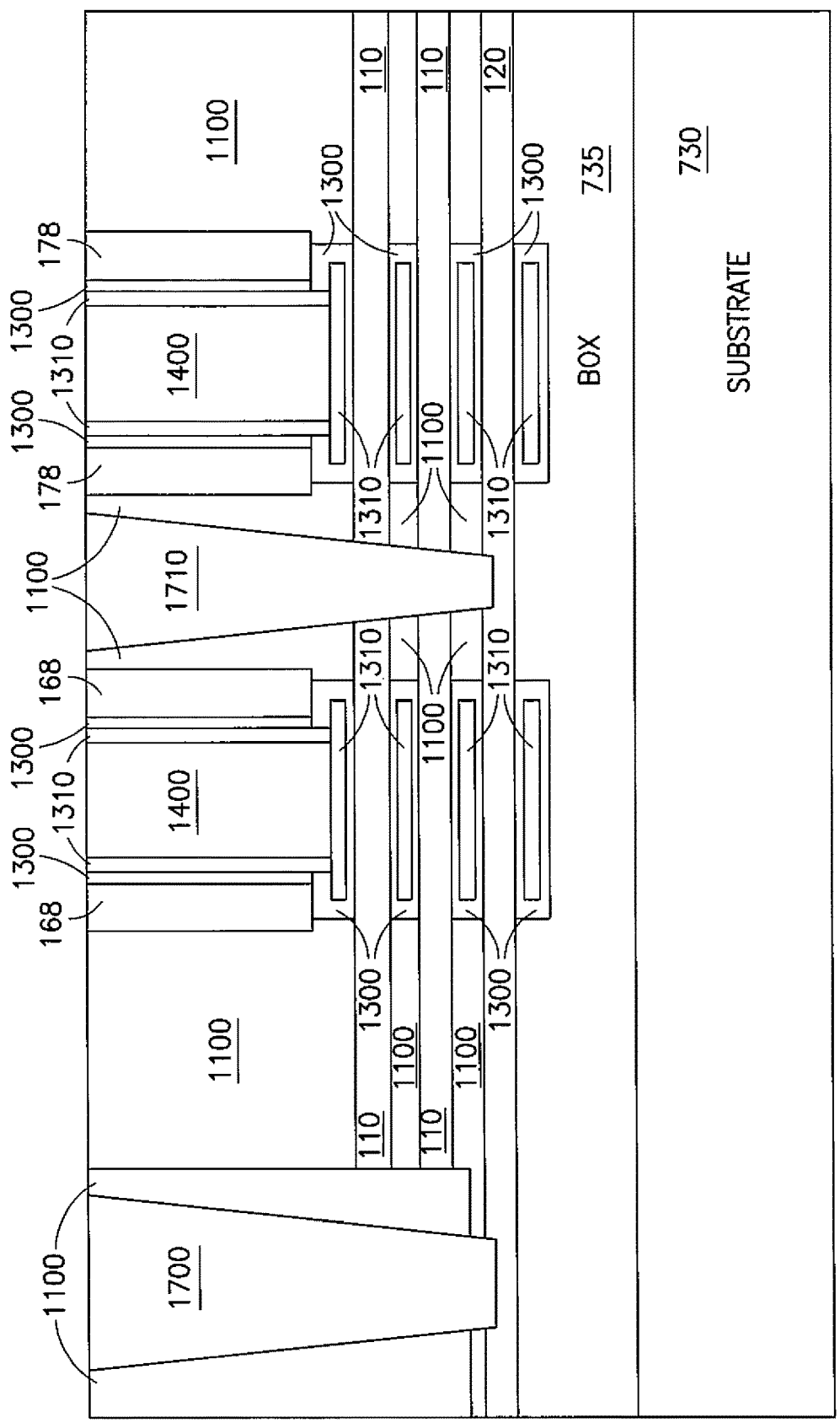

Referring now to FIG. 17, the dielectric isolation material 1100 may be etched again using RIE completely through to the bottom nanosheet layer (e.g., down to the layer of p-doped material 120). A first contact 1700 (e.g., a drain voltage contact ($V_{dd}$)) may be formed in the dielectric isolation material 1100 such that the first contact 1700 engages the bottom nanosheet layer but does not engage the layers of n-doped material 110. Also, a second contact 1710 (e.g., a voltage output contact ($V_{o1}$)) may be formed such that the second contact 1710 extends through and engages the layers of the n-doped material 110, extending down to the layer of the p-doped material 120.

Figure 18:
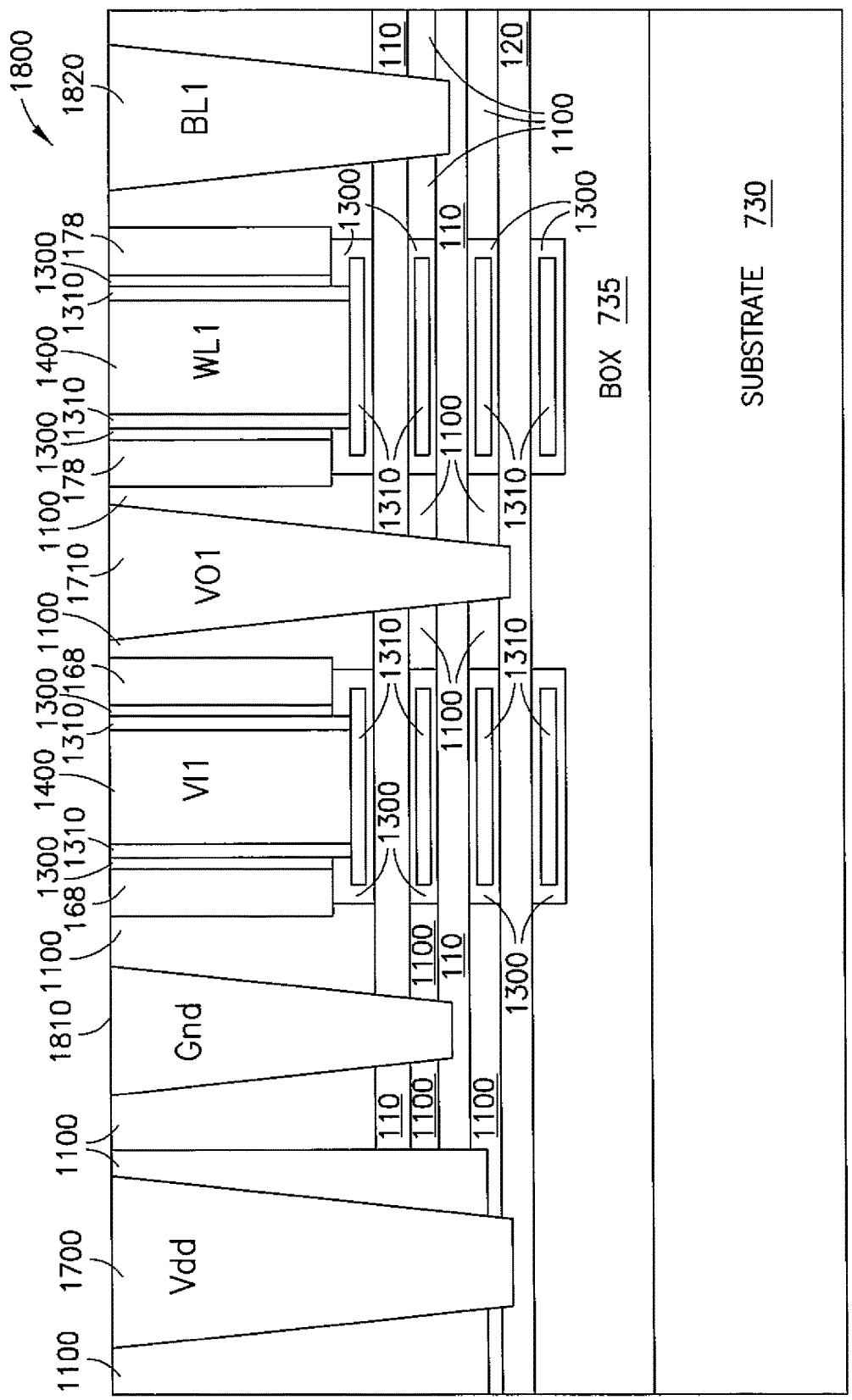
FIG. 18 is a cross-sectional view of an exemplary embodiment of process flow in which a second set of contacts is formed in the structure.
Figure 19:
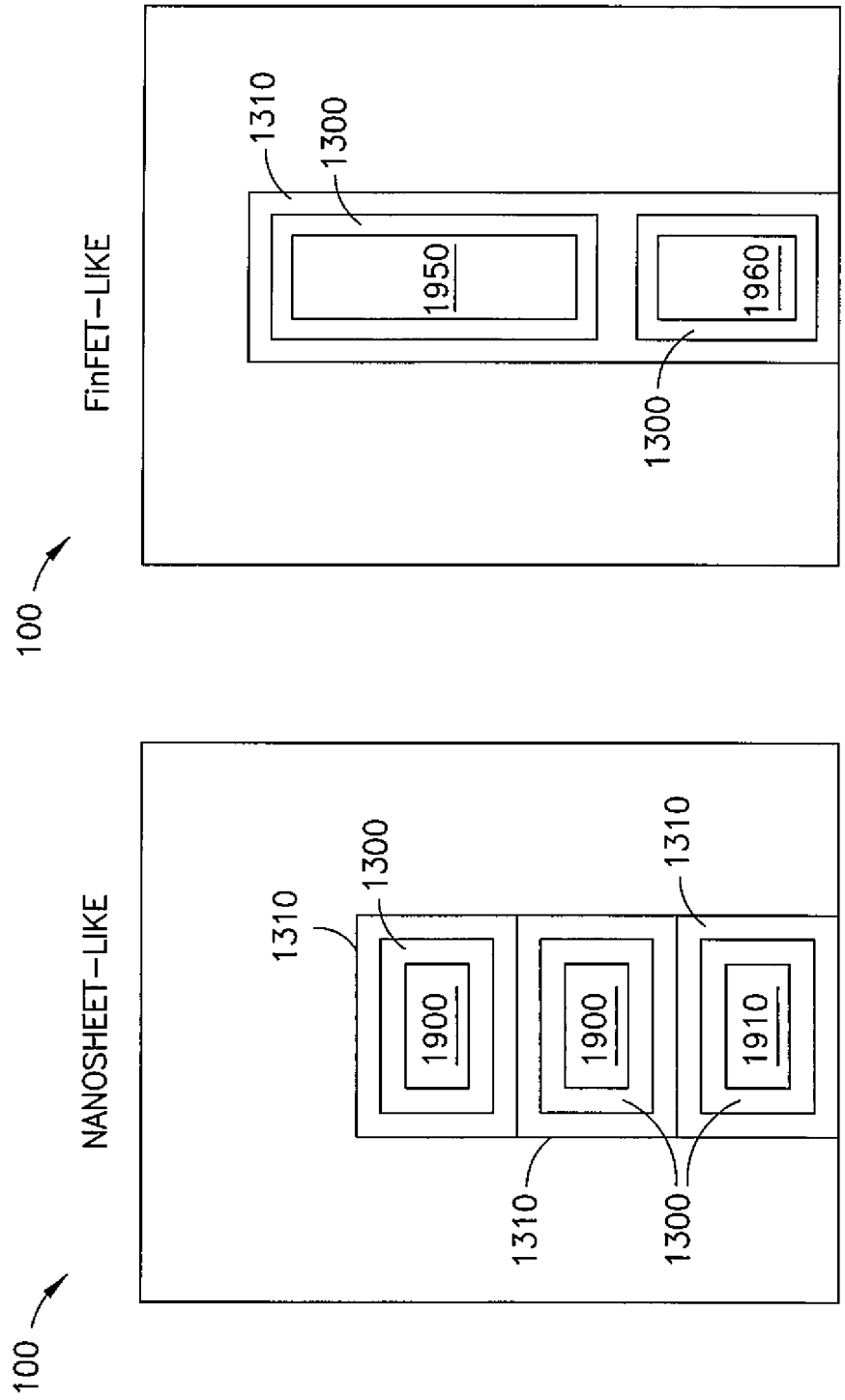
FIGS. 19A and 19B are cross-sectional views of exemplary embodiments showing various geometric variations of structures having junctionless channels.

Referring now to FIG. 18, a second contact formation 1800 may be formed in which contacts extend to the lower layer of n-doped material 110. The contacts may be formed by etching through the dielectric isolation material 1100 and through upper layers of the n-doped material 110, as necessary, using RIE. A third contact 1810 (e.g., a Gnd) and a fourth contact 1820 (e.g., BL1) may be formed in the dielectric isolation material 1100 such that the third contact 1810 and the fourth contact 1820 terminate on the lower n-doped layers 110. Upon formation of the first contact formation 1500 and the second contact formation 1800, all or part of the structure 100, suitable for use as an SRAM unit cell, is formed.

Referring now to FIGS. 19A and 19B, various geometric variations may be incorporated into the structure 100 to form the junctionless channels. As shown in FIG. 19A, the in-situ doped n-type and p-type materials of the heteroepitaxial stack may be arranged as thin nanosheets in order to achieve sufficient electrostatic control. Gamma and beta ratios may be determined by the number of n-doped layers forming junctionless NFETs 1900 and the number of p-doped layers forming a junctionless PFET 1910, the junctionless NFETs 1900 and the junctionless PFET 1910 being arranged as nanosheets. A nanosheet channel release at the gate (e.g., the RMG) may utilize an oxide etch of at least half of the nanosheet width. This may result in significant undercut under the sidewall spacers and therefore further result in a high value of outer fringe capacitance.

As shown in FIG. 19B, the in-situ doped n-type and p-type materials of the heteroepitaxial stack may be arranged to have a substantially vertical orientation, thus resulting in epitaxially grown channels comprising a junctionless NFET 1950 and a junctionless PFET 1960, both being arranged as fin-like structures. In such a fin-like structure, gamma and beta ratios may be determined by as-grown NFET and PFET channel thickness (fin height). Such fin-like structures are generally patterned narrowly for electrostatic control, which also results in channel release at the RMG being less aggressive as compared to nanosheet-like structures (owing to a smaller width). Accordingly, less undercut is realized, which also results in a lower value of outer fringe capacitance.

Figure 20:
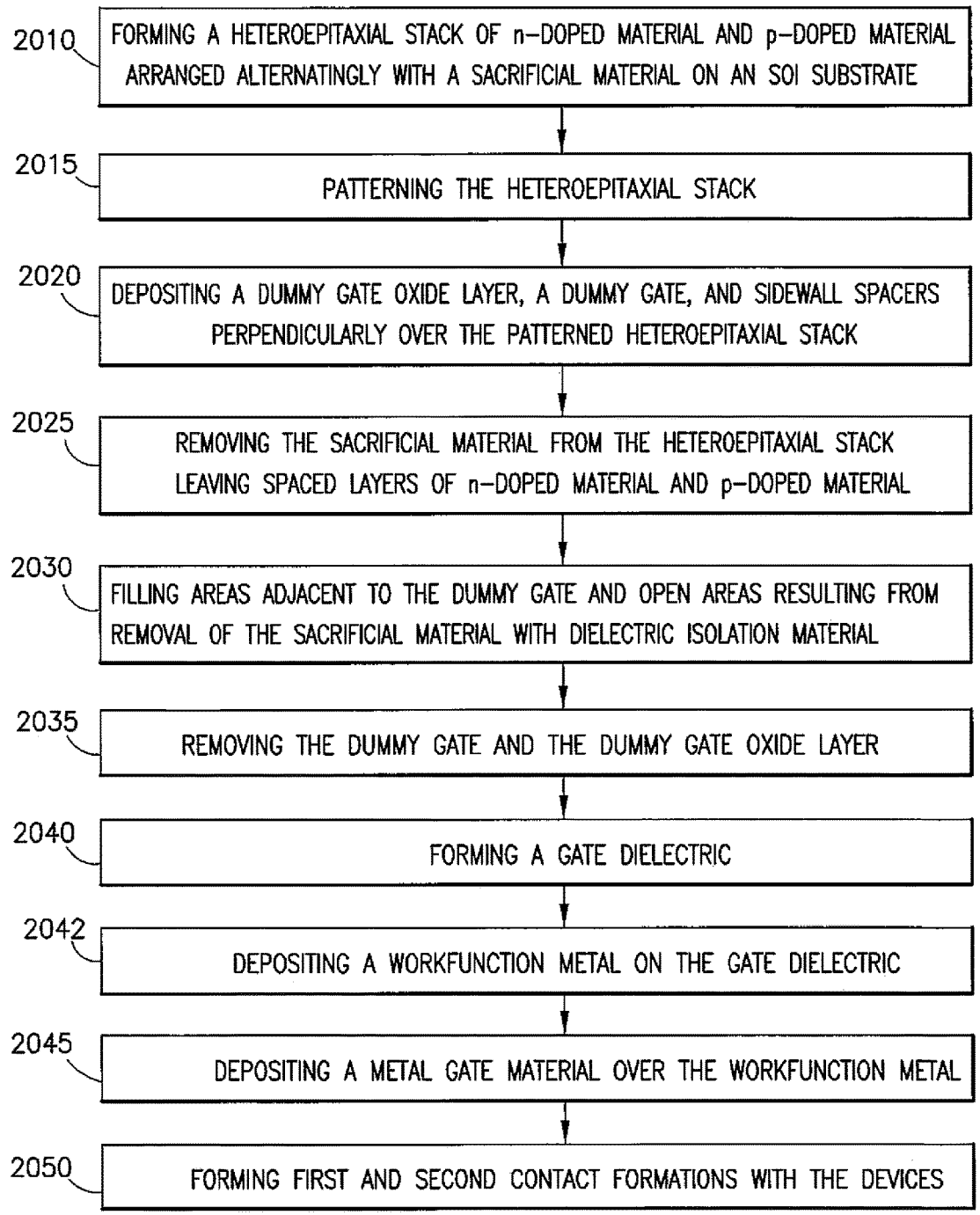
FIG. 20 is a logic flow diagram that illustrates the operation of an exemplary method, and a result of execution of computer program instructions embodied on a computer readable memory, in accordance with an exemplary embodiment of the methods for forming the structures described herein.

FIG. 20 is a logic flow diagram that illustrates the operation of a method 2000, in accordance with the exemplary embodiments. In accordance with one exemplary embodiment, in block 2010, a heteroepitaxial stack of layers of n-doped material and p-doped material are arranged alternately with a sacrificial material on an SOI substrate.

As shown in block 2015, the resulting heteroepitaxial stack of layers is patterned. As shown in block 2020, a dummy gate oxide layer, a dummy gate, and sidewall spacers are perpendicularly deposited over the patterned heteroepitaxial stack. As shown in black 2025, the sacrificial material is removed, leaving spaced layers of n-doped material and p-doped material. The areas adjacent to the dummy gate and open areas resulting from the removal of the sacrificial material are filled with dielectric isolation material, as shown in block 2030. As shown in block 2035, the dummy gate and the dummy gate oxide layer are removed. A gate dielectric may be formed, as shown in block 2040. In block 2042, a workfunction metal may be deposited on the gate dielectric. As shown in block 2045, a metal gate material may be deposited over the workfunction metal. As shown in block 2050, first and second contact formations are formed with the devices to form an SRAM unit cell having junctionless channels.

The various blocks of method 2000 shown in FIG. 20 may be viewed as method steps, and/or as operations that result from operation of computer program code, and/or as a plurality of coupled logic circuit elements constructed to carry out the associated function(s).

Referring now to all the Figures, in one exemplary embodiment, a structure comprises a first channel region forming an n-channel device; a second channel region forming a p-channel device, the p-channel device being stacked with the n-channel device in a vertical orientation; a gate positioned around the stacked n-channel device and p-channel device; and at least one source region and at least one drain region extending from each of the n-channel device and the p-channel device. Each of the at least one source region and the at least one drain region within the stacked n-channel device and p-channel device are independently contacted.

The first channel region forming an n-channel device may form a junctionless NFET device, and the second channel region forming a p-channel device may form a junctionless PFET device. The first channel region forming an n-channel device may include at least one layer of an n-doped material alternatingly arranged with at least one layer of a dielectric material, and the second channel region forming a p-channel device may include at least one layer of a p-doped material alternatingly arranged with at least one layer of the dielectric material. The first channel region forming an n-channel device may comprise at least two layers of an n-doped material, and the second channel region forming a p-channel device may comprise at least one layer of a p-doped material. The n-doped material may be doped with one or more of phosphorous and arsenic, and the p-doped material may be doped with boron. The p-channel device and the stacked n-channel device may be arranged as nanosheets. The p-channel device and the stacked n-channel device may be arranged as fins.

In another exemplary embodiment, a unit cell for a transistor structure comprises a junctionless PFET device comprising at least one layer of a p-doped material; a junctionless NFET device comprising at least two layers of an n-doped material stacked on the junctionless PFET device; an inverter gate wrapped around the stacked junctionless PFET device and junctionless NFET device; a passgate wrapped around the stacked junctionless PFET device and junctionless NFET device; a first set of contacts extending to the p-doped material of the junctionless PFET device; a second set of contacts extending to the n-doped material of the junctionless NFET device; a voltage input contact extending to the inverter gate; and a wordline contact extending to the passgate.

The first set of contacts extending to the p-doped material may comprise a drain contact, and the second set of contacts extending to the n-doped material may comprise a source contact. The junctionless PFET device may comprise at least one layer of the p-doped material alternatingly arranged with at least one layer of a dielectric material, and the junctionless NFET device may comprise at least two layers of the n-doped material alternatingly arranged with at least one layer of the dielectric material. The p-doped material may be doped with boron and the n-doped material may be doped with one or more of phosphorous and arsenic. The junctionless PFET device and the junctionless NFET device may be located on a substrate comprising bulk silicon or SOI. Each of the inverter gate and the passgate may comprise sidewall spacers and a fill metal disposed between the sidewall spacers, gate dielectric disposed on layers of n-doped material and p-doped material under the fill metal, and a workfunction metal disposed on the gate dielectric. At least one of the gate dielectric under the fill metal and the workfunction metal may extend under the sidewall spacers. The unit cell may be a structure for a static random access memory cell.

In another exemplary embodiment, a method comprises forming a heteroepitaxial stack of layers of a p-doped material, an n-doped material, and a sacrificial material; patterning the heteroepitaxial stack; forming a dummy gate on the patterned heteroepitaxial stack; forming sidewall spacers on the dummy gate; removing the sacrificial material from between the layers of p-doped material and n-doped material; depositing a dielectric isolation material adjacent the sidewall spacers and between the layers of p-doped material and n-doped material; removing the dummy gate to form a gate opening; removing the dielectric isolation material from between the layers of p-doped material and n-doped material; depositing a gate dielectric on surfaces in the gate opening and on the layers of p-doped material and n-doped material under the gate opening; depositing a workfunction metal on the gate dielectric; filling the gate opening with a fill metal; and forming contacts to the layers of p-doped material and n-doped material. The deposited gate dielectric on the layers of p-doped material and n-doped material and the deposited workfunction metal define junctionless field effect transistor devices.

Forming a heteroepitaxial stack of layers of p-doped material and n-doped material may comprise epitaxially forming layers on a substrate and doping the formed layers in situ. Forming a heteroepitaxial stack of layers of p-doped material and n-doped material may further comprise epitaxially forming the sacrificial material alternatingly between the epitaxially formed and doped layers. Removing the dielectric isolation material from between the layers of p-doped material and n-doped material may further comprise removing a portion of the dielectric isolation material from under the sidewall spacers.

In the foregoing description, numerous specific details are set forth, such as particular structures, components, materials, dimensions, processing steps, and techniques, in order to provide a thorough understanding of the exemplary embodiments disclosed herein. However, it will be appreciated by one of ordinary skill of the art that the exemplary embodiments disclosed herein may be practiced without these specific details. Additionally, details of well-known structures or processing steps may have been omitted or may have not been described in order to avoid obscuring the presented embodiments. It will be understood that when an element as a layer, region, or substrate is referred to as being "on" or "over" another element, it can be directly on the other element or intervening elements may also be present. In contrast, when an element is referred to as being "directly on" or "directly" over another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

The description of the present invention has been presented for purposes of illustration and description, but is not intended to be exhaustive or limiting in the form disclosed. Many modifications and variations will be apparent to those of ordinary skill in the art without departing from the scope of the invention. The embodiments were chosen and described in order to best explain the principles of the invention and the practical applications, and to enable others of ordinary skill in the art to understand the invention for various embodiments with various modifications as are suited to the particular uses contemplated.

What is claimed is:

1. A method, comprising:
    forming a heteroepitaxial stack of layers of a p-doped material, an n-doped material, and a sacrificial material;
    patterning the heteroepitaxial stack;
    forming a dummy gate on the patterned heteroepitaxial stack;
    forming sidewall spacers on the dummy gate;
    removing the sacrificial material from between the layers of p-doped material and n-doped material;
    depositing a dielectric isolation material adjacent the sidewall spacers and between the layers of p-doped material and n-doped material;
    removing the dummy gate to form a gate opening;
    removing the dielectric isolation material from between the layers of p-doped material and n-doped material;
    depositing a gate dielectric on surfaces in the gate opening and on the layers of p-doped material and n-doped material under the gate opening;
    depositing a workfunction metal on the gate dielectric;
    filling the gate opening with a fill metal; and
    forming contacts to the layers of p-doped material and n-doped material;
    wherein the deposited gate dielectric on the layers of p-doped material and n-doped material and the deposited workfunction metal define junctionless field effect transistor devices.

2. The method of claim 1, wherein forming a heteroepitaxial stack of layers of p-doped material and n-doped material comprises epitaxially forming layers on a substrate and doping the formed layers in situ.

3. The method of claim 2, wherein forming a heteroepitaxial stack of layers of p-doped material and n-doped material further comprises epitaxially forming the sacrificial material alternatingly between the epitaxially formed and doped layers.

4. The method of claim 1, wherein removing the dielectric isolation material from between the layers of p-doped material and n-doped material further comprises removing a portion of the dielectric isolation material from under the sidewall spacers.

5. The method of claim 1, wherein the heteroepitaxial stack of layers is formed on an SOI substrate provided as having a handle portion and an SOI layer.

6. The method of claim 1, wherein forming the p-doped material of the heteroepitaxial stack of layers comprises doping with boron.

7. The method of claim 1, wherein forming the n-doped material of the heteroepitaxial stack of layer comprises doping with one or more of phosphorous and arsenic.

8. The method of claim 1, wherein forming a dummy gate comprises depositing a dummy gate oxide on the heteroepitaxial stack of layers, depositing a layer of polysilicon material on the dummy gate oxide layer, and etching the dummy gate oxide and the polysilicon material to form the dummy gate.

9. The method of claim 8, wherein forming sidewall spacers on the dummy gate comprises epitaxially growing, depositing, or forming the sidewall spacers on sides of the polysilicon material.

10. The method of claim 9, wherein the sidewall spacers are deposited on the sides of the polysilicon material using a chemical vapor deposition process.

11. The method of claim 1, wherein removing the dummy gate to form the gate opening comprises applying a wet etching process.

12. The method of claim 1, wherein removing the sacrificial material from between the layers of p-doped material and n-doped material comprises applying an aqueous hot phosphoric acid wash to the heteroepitaxial stack of layers.

13. The method of claim 1, wherein the gate dielectric is deposited using a chemical vapor deposition technique.

14. The method of claim 1, wherein the workfunction metal is deposited using atomic layer deposition.

15. A method, comprising:
    forming a stack of layers of a p-doped material and an n-doped material on a substrate, each of the layers of the p-doped material and the n-doped material being separated from each other;
    forming a gate opening in the stack;
    depositing a gate dielectric material and a workfunction material between the separated layers of p-doped material and n-doped material;
    filling the gate opening with a fill metal; and
    forming a first contact arrangement to the layer of p-doped material and a second contact arrangement to the layer of n-doped material;
    wherein the gate dielectric material and the workfunction material define junctionless field effect transistors.

16. The method of claim 15, wherein forming the layers of p-doped material comprises doping with boron.

17. The method of claim 15, wherein forming the layers of n-doped material comprises doping with one or more of phosphorous and arsenic.

18. The method of claim 15, wherein the gate dielectric material is deposited using a chemical vapor deposition technique, and wherein the workfunction material is deposited using atomic layer deposition.

19. The method of claim 15, wherein forming the first contact arrangement to the layer of p-doped material comprises forming a first contact extending to and terminating on one of the layers of p-doped material without engaging a layer of n-doped material and forming a second contact to the layer of p-doped material extending through and engaging at least one layer of n-doped material and terminating on the layer of p-doped material.

20. The method of claim 19, wherein forming the second contact arrangement to the layer of n-doped material comprises forming a third contact and a fourth contact each extending to and terminating on the layer of n-doped material.

\* \* \* \* \*